United States Patent
Kimura et al.

(10) Patent No.: US 11,041,826 B2
(45) Date of Patent: Jun. 22, 2021

(54) OBSERVATION METHOD AND OBSERVATION DEVICE

(71) Applicants: National University Corporation Kobe University, Hyogo (JP); Integral Geometry Science inc., Hyogo (JP)

(72) Inventors: Kenjiro Kimura, Hyogo (JP); Noriaki Kimura, Hyogo (JP)

(73) Assignees: National University Corporation Kobe University, Hyogo (JP); Integral Geometry Science Inc., Hyogo (JP)

( * ) Notice: Subject to any disclaimer, the term of this patent is extended or adjusted under 35 U.S.C. 154(b) by 483 days.

(21) Appl. No.: 15/775,905

(22) PCT Filed: Nov. 15, 2016

(86) PCT No.: PCT/JP2016/083867
§ 371 (c)(1),
(2) Date: May 14, 2018

(87) PCT Pub. No.: WO2017/086325
PCT Pub. Date: May 26, 2017

(65) Prior Publication Data
US 2018/0328887 A1    Nov. 15, 2018

(30) Foreign Application Priority Data

Nov. 16, 2015 (JP) .............................. JP2015-224321

(51) Int. Cl.
*G01N 27/72* (2006.01)
*G01N 27/02* (2006.01)
(Continued)

(52) U.S. Cl.
CPC ............. *G01N 27/72* (2013.01); *G01R 27/02* (2013.01); *G01R 33/00* (2013.01); *G01R 33/022* (2013.01);
(Continued)

(58) Field of Classification Search
CPC ....... G01R 33/022; B82Y 25/00; G01Q 30/04
See application file for complete search history.

(56) References Cited

U.S. PATENT DOCUMENTS 8,125,220 B2  2/2012 Igney et al.
8,536,862 B2  9/2013 Kimura et al.
(Continued)

FOREIGN PATENT DOCUMENTS

JP  2003-222664  8/2003
JP  2009-520549  5/2009
(Continued)

OTHER PUBLICATIONS

Kimura K. et al., "*Development of magnetic imaging device with electromagnetic field reconstruction method and application to failure analysis of electric components*", Electro. Packaging Technol., vol. 28, Jan. 1, 2012, pp. 16-20.
(Continued)

*Primary Examiner* — Jermele M Hollington
*Assistant Examiner* — Suresh K Rajaputra
(74) *Attorney, Agent, or Firm* — Wenderoth, Lind & Ponack, L.L.P.

(57) ABSTRACT

Provided is a measurement device including an application unit, a detection unit, and a calculation unit. The application unit applies a first magnetic field, which is generated by applying a pulse current to a coil or applying currents with a plurality of frequencies to the coil in order, to an object. The detection unit detects a second magnetic field which is generated by applying the first magnetic field to the object. The calculation unit calculates a distribution of a magnetic field source m in the second magnetic field. The calculation unit may further generate an imaging signal for displaying the calculated distribution of the magnetic field source m, as an image. The display unit displays the image indicating the distribution of the magnetic field source m by using the imaging signal.

10 Claims, 12 Drawing Sheets

(51) Int. Cl.
G01R 33/10 (2006.01)
G01R 27/02 (2006.01)
G01R 33/00 (2006.01)
G01R 33/09 (2006.01)
G01R 33/022 (2006.01)
G01Q 30/04 (2010.01)

(52) U.S. Cl.
CPC .......... *G01R 33/093* (2013.01); *G01R 33/10* (2013.01); *G01Q 30/04* (2013.01)

(56) References Cited

U.S. PATENT DOCUMENTS

| | | |
|---|---|---|
| 9,568,567 B2 | 2/2017 | Kimura |
| 2008/0258717 A1 | 10/2008 | Igney et al. |
| 2010/0219819 A1 | 9/2010 | Kimura et al. |
| 2014/0081584 A1* | 3/2014 | Kimura .............. G01R 33/0064 702/57 |
| 2015/0241372 A1 | 8/2015 | Feldkamp et al. |
| 2016/0231277 A1 | 8/2016 | Molenda et al. |
| 2017/0016963 A1 | 1/2017 | Kimura et al. |

FOREIGN PATENT DOCUMENTS

| | | |
|---|---|---|
| WO | 2008/123432 | 10/2008 |
| WO | 2012/153496 | 11/2012 |
| WO | 2015/136931 | 9/2015 |

OTHER PUBLICATIONS

Extended European Search Report dated Jul. 9, 2019 in European Patent Application No. 16866326.8.

International Search Report dated Feb. 14, 2017 in International (PCT) Application No. PCT/JP2016/083867.

Stephen J. Norton et al., "Theory of eddy current inversion", J. Appl. Phys., 73(2), Jan. 15, 1993.

* cited by examiner

|  | CONDUCTIVITY (S/m) | RELATIVE MAGNETIC PERMEABILITY | SKIN DEPTH $\delta$ (mm) |
|---|---|---|---|
| Al | $3.7 \times 10^{-5}$ | 1 | 2.6(1kHz) |
| Fe | $9.9 \times 10^{-6}$ | 5000 | 0.07(1kHz) |
| INTRACELLULAR FLUID | 0.3-3.0 | 1 | 29-92(100MHz) |
| SEAWATER | 5.0 | 1 | 23(100MHz) |
| TAP WATER | 0.01 | 1 | 500(100MHz) |

FIG. 10

| | CONDUCTIVITY (S/m) | DIELECTRIC CONSTANT (F/m) | MAGNETIC PERMEABILITY (H/m) | $\omega\varepsilon/\sigma$ | PENETRATION DEPTH $\delta s$ (mm) |
|---|---|---|---|---|---|
| 10(MHz) | 0.3-3.0 | $8.854 \times 10^{-11}$ | $4\pi \times 10^{-7}$ | 0.00556 | 160.0 |
| 100(MHz) | | | | 0.0556 | 51.7 |
| 1(GHz) | | | | 0.556 | 20.8 |
| 10(GHz) | | | | 5.56 | 16.9 |

OBSERVATION METHOD AND OBSERVATION DEVICE

TECHNICAL FIELD

The present invention relates to an observation device and an observation method.

BACKGROUND ART

In recent years, the spatial distribution of a magnetic field (hereinafter, also referred to as magnetic field distribution) has been used in various fields such as the specification of the position of an abnormal current path inside an electronic component or the examination of a disease part in a human body (see, for example, Patent Documents 1 and 2).

Patent Document 1 discloses a method of measuring three-dimensional distribution of a magnetic field, an electric field, or the like in a three-dimensional space. In the measurement method, a fundamental equation (Laplace's equation) of a static magnetic field is analytically solved by using a two-dimensional magnetic field distribution and a distribution of two-dimensional magnetic field gradient, which are obtained on a specific measurement plane, as boundary conditions to thereby obtain a three-dimensional magnetic field distribution in a space in the vicinity of the measurement plane. In the method disclosed in Patent Document 1, it is possible to image the structure of a magnetic field generation source by using measurement data of a magnetic field distribution obtained in a region which is distant from a generation source of a magnetic field (magnetic field generation source). The image showing the structure of the magnetic field generation source can be used is used for, for example, medical diagnosis, failure analysis of electronic components, and the like.

In addition, Patent Document 2 discloses a technique for measuring a magnetic field formed by an eddy current generated by the application of an external magnetic field to an unknown sample and estimating a conductivity distribution. In this method, a vector distribution of current density is estimated on the basis of an integral equation (Biot-Savart law) from measurement results for a magnetic field, and a conductivity distribution inside a target sample is derived by solving a first-order space partial differential equation that the current density follows.

RELATED DOCUMENTS

Patent Documents

[Patent Document 1] Pamphlet of International Publication No. 2008/123432
[Patent Document 2] Japanese Unexamined Patent Publication No. 2003-222664

SUMMARY OF THE INVENTION

Technical Problem

However, in the technique disclosed in Patent Document 2, a current density distribution is calculated through a numerical calculation process for minimizing a functional defined by a measured magnetic field and a current in a process of calculating the current density distribution from the measured magnetic field, and thus a current density distribution, which is calculated in a case where the amount of information is not sufficient, depends on an initial model of the current density distribution, and much time is required for the convergence of calculation. In addition, a conductivity distribution obtained using a continuity equation also depends on the initial model. Therefore, there is a problem in the accuracy and reliability of results of the obtained conductivity distribution.

Consequently, an object of the invention is to provide an observation method and an observation device which are capable of performing high-speed imaging (imaging) of a distribution of a spatial change rate of conductivity inside an object, with a high level of accuracy.

Solution to Problem

In order to solve the above-described problem, an observation method according to the invention includes an application step of applying a first magnetic field, which is generated by applying a pulse current to a coil or applying currents with a plurality of frequencies to the coil in order, to an object, a detection step of detecting a second magnetic field generated by applying the first magnetic field to the object, and a calculation step of calculating a distribution of a magnetic field source m in the second magnetic field.

Thereby, a fundamental equation of a field is analytically solved, and information corresponding to a distribution of a spatial change rate of a conductivity is calculated by utilizing measurement data as a boundary condition, without using a numerical calculation process for minimizing a functional defined by a measured magnetic field and a current. Thus, it is possible to observe a distribution of a spatial change rate of a conductivity inside an object with a high level of accuracy. Therefore, it is possible to three-dimensionally, nondestructively, and accurately calculate the information corresponding to the spatial change rate of the conductivity in the object.

In addition, the observation method according to the invention may further include a step of generating an imaging signal for displaying the calculated distribution of the magnetic field source m, as an image, and a step of displaying an image indicating the distribution of the magnetic field source m by using the imaging signal.

Thereby, it is possible to visually perceive observation results.

In addition, the first magnetic field and the second magnetic field may be quasi-steady magnetic fields.

Thereby, it is possible to observe a spatial change in a conductivity inside an electrical conductive material, which is difficult to observe in high-frequency electromagnetic waves or a steady magnetic field, as an object to be observed.

In addition, a frequency band of the pulse current or the currents with the plurality of frequencies may be equal to or less than 1 GHz.

Thereby, it is possible to observe a spatial change in a conductivity inside the object, such as a living body, which has a low conductivity relative to metals and has a non-negligible dielectric effect.

In addition, the magnetic field source m may satisfy (Equation 15) to be described later.

Thereby, it is possible to observe a distribution of a spatial change rate of conductivity inside the object, with a high level of accuracy.

In addition, a function obtained by performing two-dimensional Fourier transform on the magnetic field source m may satisfy (Equation 37) to be described later.

Thereby, it is possible to calculate reconstructed image data corresponding to a distribution of a spatial change rate of a conductivity in a region having a defect in the object.

In addition, a function obtained by performing two-dimensional Fourier transform on the magnetic field source m may be expressed by series expansion shown in (Equation 44) to be described later, the magnetic field source m may be calculated using (Equation 44), and $a_n$ in (Equation 44) may satisfy (Equation 47) to be described later.

Thereby, coefficients obtained by performing series expansion on a function, which is obtained by performing two-dimensional Fourier transform on a magnetic field source m(x,y,z) with respect to x and y, by using a variable z are sequentially obtained using experimental data, and thus it is possible to precisely obtain information corresponding to a distribution of a spatial change rate of a three-dimensional conductivity.

In addition, the object may be a non-magnetic body.

In order to solve the above-described problem, an observation device according to the invention include an application unit that applies a first magnetic field, which is generated by applying a pulse current to a coil or applying currents with a plurality of frequencies to the coil in order, to an object, a detection unit that detects a second magnetic field generated by applying the first magnetic field to the object, and a calculation unit that calculates a distribution of a magnetic field source m in the second magnetic field.

Thereby, a fundamental equation of a field is analytically solved, and information corresponding to a distribution of a spatial change rate of a conductivity is calculated by utilizing measurement data as a boundary condition, without using a numerical value calculation process for minimizing a functional defined by a measured magnetic field and a current. Thus, it is possible to observe a distribution of a spatial change rate of a conductivity inside an object with a high level of accuracy. Therefore, it is possible to three-dimensionally, nondestructively, and accurately calculate the information corresponding to the spatial change rate of the conductivity in the object.

The calculation unit may generate an imaging signal for displaying the calculated distribution of the magnetic field source m, as an image, and the observation device may further include a display unit that displays the image indicating the distribution of the magnetic field source m by using the imaging signal.

Thereby, it is possible to visually perceive observation results.

In addition, the first magnetic field and the second magnetic field may be quasi-steady magnetic fields.

Thereby, it is possible to observe a spatial change in a conductivity inside an electrical conductive material, which is difficult to observe in high-frequency electromagnetic waves or a steady magnetic field, as an object to be observed.

In addition, a frequency band of the pulse current or the currents with the plurality of frequencies may be equal to or less than 1 GHz.

Thereby, it is possible to observe a spatial change in a conductivity inside the object, such as a living body, which has a low conductivity relative to metals and has a non-negligible dielectric effect.

In addition, the magnetic field source m may satisfy (Equation 15) to be described later.

Thereby, it is possible to observe a distribution of a spatial change rate of conductivity inside the object, with a high level of accuracy.

In addition, a function obtained by performing two-dimensional Fourier transform on the magnetic field source m may satisfy (Equation 37) to be described later.

Thereby, it is possible to calculate reconstructed image data corresponding to a distribution of a spatial change rate of a conductivity in a region having a defect in the object.

In addition, a function obtained by performing two-dimensional Fourier transform on the magnetic field source m may be expressed by series expansion shown in (Equation 44) to be described later, the magnetic field source m may be calculated using (Equation 44), and $a_n$ in (Equation 44) may satisfy (Equation 47) to be described later.

Thereby, coefficients obtained by performing series expansion on a function, which is obtained by performing two-dimensional Fourier transform on a magnetic field source m(x,y,z) with respect to x and y, by using a variable z are sequentially obtained using experimental data, and thus it is possible to precisely obtain information corresponding to a distribution of a spatial change rate of a three-dimensional conductivity.

In addition, the object may be a non-magnetic body.

Advantageous Effects of Invention

According to the invention, it is possible to observe a distribution of a spatial change rate of conductivity inside an object, with a high level of accuracy.

BRIEF DESCRIPTION OF THE DRAWINGS

The above-described objects, other objects, features and advantages will be further apparent from the preferred embodiments described below, and the accompanying drawings as follows.

FIG. 10 is a diagram illustrating a relationship between a frequency component of a magnetic field to be applied and a penetration depth of the magnetic field.

DESCRIPTION OF EMBODIMENTS

Figure 1:
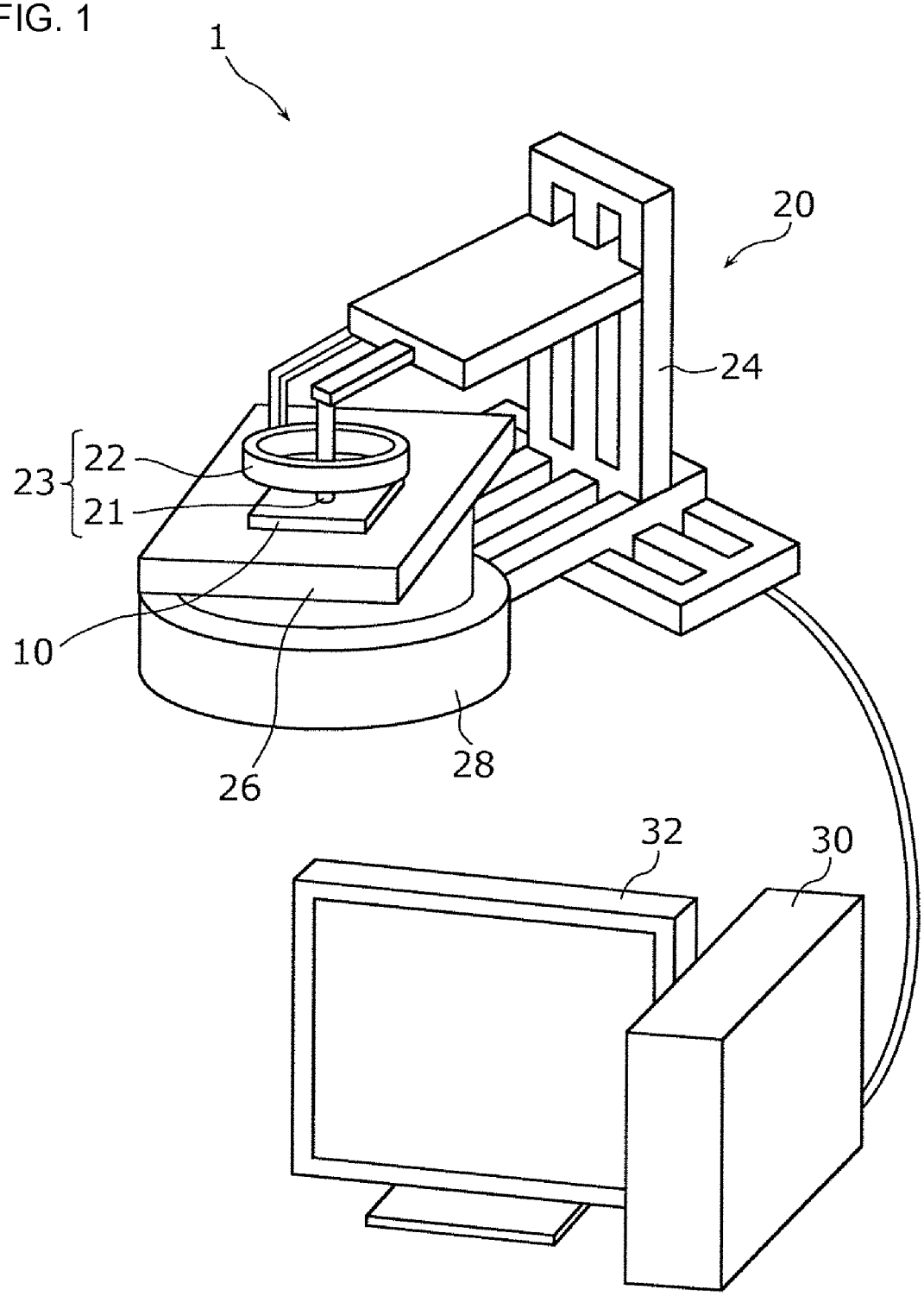
FIG. 1 is a schematic diagram of an observation device according to a first embodiment.

Hereinafter, an embodiment according to the invention will be described with reference to the accompanying drawings. Meanwhile, in the drawings, components denoted by the same reference numerals and signs indicate the same or the same type of components.

The embodiment described below shows a preferred specific example of the invention. Numerical values, shapes, materials, components, arrangement positions of the components, connection configurations of the components, steps (processes), the order of the steps, and the like which are shown in the following embodiment are examples, and therefore do not limit the scope of the invention. Among the components described in the following embodiment, the components that are not described in independent claims indicating top concepts in the invention are described as arbitrary components, which configure more preferred configurations. Meanwhile, bold variables in equations described below indicate that the variables are vectors.

First Embodiment

[1. Configuration of Observation Device]

Figure 2:
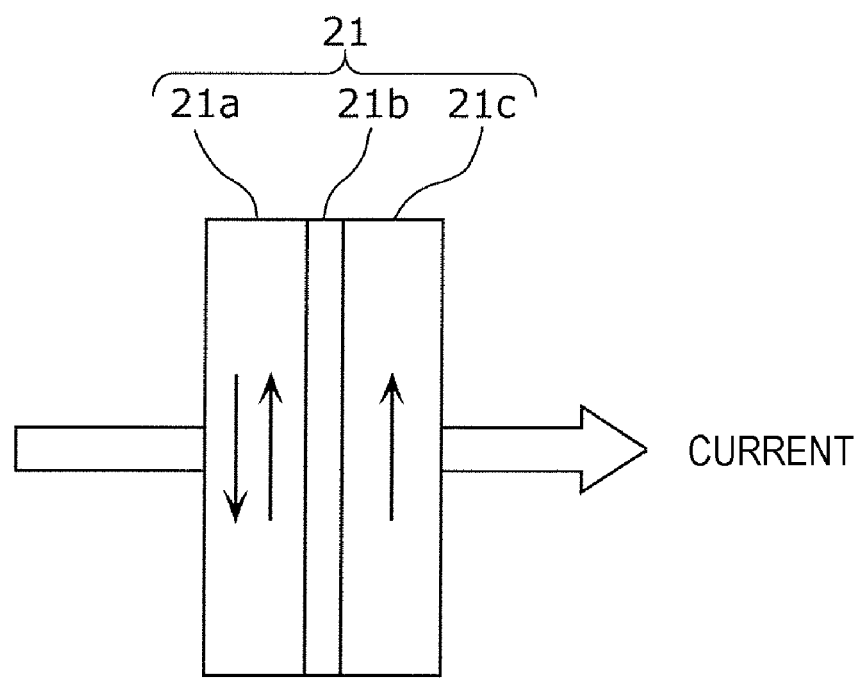
FIG. 2 is a schematic diagram illustrating a configuration of a magnetic sensor according to the first embodiment.
Figure 3:
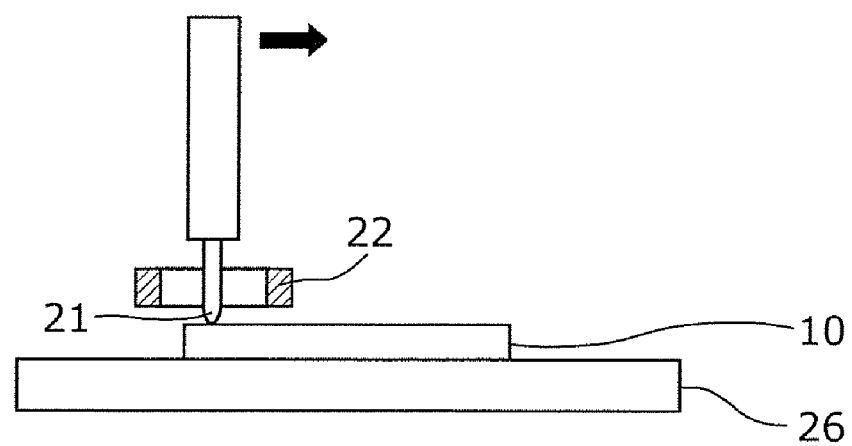
FIG. 3 is a diagram illustrating a positional relationship between a probe and an object according to the first embodiment.

First, an observation device according to a first embodiment will be described. FIG. 1 is a schematic diagram illustrating a configuration of the observation device according to this embodiment. FIG. 2 is a schematic diagram illustrating a configuration of a magnetic sensor. FIG. 3 is a diagram illustrating a positional relationship between a probe and an object to be observed.

A measurement device 1 according to this embodiment includes an application unit, a detection unit, and a calculation unit. The application unit applies a first magnetic field, which is generated by applying a pulse current to a coil 22 or applying currents with a plurality of frequencies to the coil 22, to an object 10 (application step). The detection unit detects a second magnetic field which is generated by applying the first magnetic field to the object 10 (detection step). The calculation unit calculates a distribution of a magnetic field source m in the second magnetic field (calculation step). Details thereof will be described below.

In the example illustrated in FIG. 1, the observation device 1 is a device that observes a distribution of a spatial change rate of conductivity inside the object 10, and includes a measurement unit 20, a computational unit 30, and a display unit 32.

In the example illustrated in the drawing, the calculation unit further generates an imaging signal for displaying the calculated distribution of the magnetic field source m as an image. The display unit 32 displays an image indicating the distribution of the magnetic field source m by using the imaging signal.

The object 10 is constituted by, for example, a metal welded portion. A defect and the like inside the object 10 are observed from the distribution of the conductivity by the observation device 1 according to this embodiment. Meanwhile, the object 10 is not limited to the metal welded portion, and does not matter as long as it is possible to observe conductivity with respect to the object.

The measurement unit 20 is a device that measures a magnetic field, and includes a probe 23 constituted by a sensor 21 and the coil 22, a probe stage 24 for moving the probe 23 in X, Y, and Z directions, an observation stage 26 on which the object 10 is mounted, and a turntable 28 which is capable of changing the orientation of the observation stage 26 in an in-plane direction.

The sensor 21 is a magnetic field sensor that measures a spatial distribution of a magnetic field in the object 10. The sensor 21 detects a magnetic field which is generated by an eddy current generated inside the object 10 by a magnetic field which is applied by the coil 22 to be described later. Therefore, the sensor 21 is equivalent to a detection unit in the invention. In addition, the above-described magnetic field which is generated by an eddy current generated inside the object 10 is equivalent to a second magnetic field in the invention. The second magnetic field is detected by the sensor 21 on the surface of the object.

The sensor 21 is constituted by, for example, a Tunneling Magneto Resistive Sensor (TMR sensor). Specifically, in the TMR sensor, as illustrated in FIG. 2, an insulating film layer is interposed between magnetic thin films of approximately 10 nm to 100 nm. In more detail, the TMR sensor includes three thin films of a soft layer 21a, a tunnel layer 21b, and a PIN layer (pinned layer) 21c. The soft layer 21a is constituted by a magnetic body of which the magnetization direction fluctuates depending on an outside magnetization direction. The PIN layer 21c is constituted by a magnetic body of which the magnetization direction does not fluctuate. The tunnel layer 21b is an insulating film.

The TMR sensor has different electric resistances in a case where the magnetization direction in the soft layer 21a and the magnetization direction in the PIN layer 21c are the same as each other and in a case where there the magnetization directions are different from each other. A magnetic field is measured using the change in the electric resistance.

That is, the sensor 21 measures a magnetic field by using the above-described characteristics. Meanwhile, the sensor 21 may be constituted by another element such as a Giant Magneto Resistive (GMR) element or a SQUID element, instead of being constituted by a TMR sensor. In addition, the sensor 21 is not limited to a sensor that measures a magnetic field, and may be a sensor that detects other types of parameters. In addition, the sensor 21 may detect the first magnetic field in addition to the second magnetic field. However, it is preferable that the magnitude of the first magnetic field detected by the sensor 21 is small in order to improve an S/N ratio.

The coil 22 is configured such that a conductive thin wire is annularly wound a plurality of times. The sensor 21 is disposed in the vicinity of the center of the coil 22 formed annularly, as illustrated in FIG. 3. In addition, a pulse current is supplied to the coil 22 from a power supply (not shown), and a magnetic flux is generated so as to pass through the annular coil 22 by the supplied pulse current. A pulse-shaped magnetic field is applied to the object 10 by the generated magnetic field. The power supply that supplies a pulse current to the coil 22 may be provided inside the computational unit 30, or may be provided separately from the computational unit 30.

Meanwhile, here, the magnetic field to be applied to the object 10 is equivalent to the first magnetic field applied to the object 10 from the coil 22 in the invention. In addition, the coil 22 is equivalent to an application unit in the invention. In addition, the position of the sensor 21 disposed with respect to the coil 22 is not limited to the example in this drawing, and may be a position where a magnetic field which is generated by an eddy current generated inside the object 10 by the coil 22 can be detected.

Here, the magnetic field which is generated by an eddy current generated inside the object 10 by the coil 22 is a magnetic field in a quasi-steady state, that is, a quasi-steady magnetic field. The quasi-steady magnetic field refers to a magnetic field indicating an intermediate state between a static magnetic field (steady magnetic field) and a high-frequency magnetic field. Regarding the steady magnetic field, it is possible to measure a magnetic field only in a case where a current flows steadily or magnetism remains inside the object. In addition, the high-frequency magnetic field can be incident on and propagated through an insulator, but cannot be incident on and propagated through a conductor. Therefore, any of the cases is not suitable for the measurement of a magnetic field inside a conductor.

On the other hand, the quasi-steady magnetic field can be incident and propagated through a conductor, and it is possible to measure a magnetic field related to the internal structure of the conductor even when a current does not flow steadily or magnetism does not remain. Therefore, the observation device 1 according to this embodiment includes imaging software based on an analysis model using a quasi-steady magnetic field, as described later. In addition, the magnetic field which is generated by an eddy current generated inside the object 10 by the coil 22 is, for example, set to be a magnetic field in a frequency band satisfying $2\pi f\varepsilon \ll \sigma$ which is a frequency referred to as a quasi-steady magnetic field.

In this embodiment, the first magnetic field and the second magnetic field are quasi-steady magnetic fields. In addition, a frequency band of a pulse current or currents with a plurality of frequencies flowing to the coil 22 is a frequency band satisfying $2\pi f\varepsilon \ll \sigma$, and specifically is, for example, equal to or less than 1 GHz.

The probe stage 24 is a mechanism which is provided to perform scanning in each of the X, Y, and Z directions so that the probe 23 is disposed at a predetermined position. The probe 23 is disposed at the tip end of the probe stage 24.

The probe 23 is disposed such that the annular coil 22 becomes parallel to the surface of the object 10, for example, as illustrated in FIG. 3. The sensor 21 may abut on the surface of the object 10, or may be disposed at a position separated from the surface of the object 10 at a fixed distance. The probe 23 moves into the surface of the object 10 along the surface of the object 10. Thereby, the probe 23 applies a magnetic field by the coil 22 at a desired position of the object 10 and measures the magnetic field by the sensor 21.

The computational unit 30 calculates reconstructed image data obtained by analyzing a magnetic field source m (a value corresponding to a spatial change rate of a conductivity) by using measurement data on the magnetic field measured by the measurement unit 20, and generates reconstructed image data (imaging signal) for displaying the distribution of the magnetic field source m corresponding to the spatial change rate of the conductivity, as an image, from the calculated reconstructed image data. In addition, the computational unit 30 transmits the reconstructed image data (imaging signal) to the display unit 32, and displays an image corresponding to the reconstructed image data (imaging signal). The computational unit 30 is constituted by an electronic computer (computer), for example, as illustrated in FIG. 1. The computational unit 30 is equivalent to a calculation unit in the invention.

The display unit 32 displays the reconstructed image data generated by the computational unit 30 to display the spatial change rate distribution of the conductivity as an image. The display unit 32 is a display device (display) including a screen, for example, as illustrated in FIG. 1.

Figure 4:
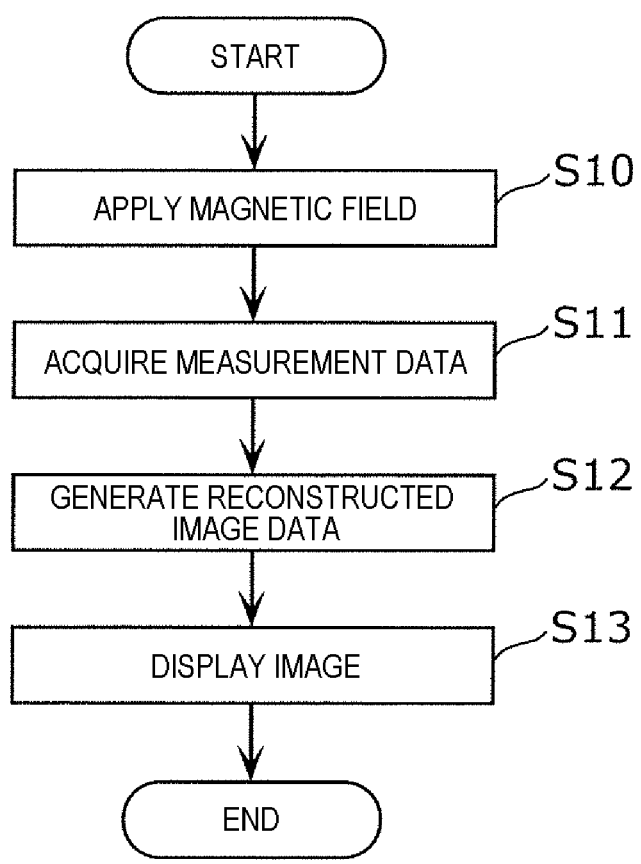
FIG. 4 is a flowchart illustrating the procedure of observation according to the first embodiment.

FIG. 4 is a flowchart illustrating the procedure of observation.

In a case where observation is performed by the observation device 1, first, a magnetic field is applied to the object 10 by the coil 22 as illustrated in FIG. 4 (step S10). Specifically, as described above, a pulse current is applied to the coil 22 from the power supply. In this case, a magnetic field having a pulse shape is generated inside the annular coil 22. The magnetic field is applied to the object 10. Meanwhile, as a current to be applied, a current having a predetermined frequency may be sequentially applied while changing the frequency of the current. Next, a magnetic field which is generated by an eddy current generated inside the object 10 when applying a magnetic field to the object 10 is detected by the sensor 21 to obtain measurement data (step S11).

Further, the computational unit 30 calculates information corresponding to the spatial change rate distribution of the conductivity of the object 10 from the magnetic field detected by the sensor 21. More specifically, reconstructed image data indicating the spatial change rate distribution of the conductivity of the object 10 is generated from the magnetic field detected by the sensor 21, that is, the measurement data (step S12). An image is displayed on the display unit 32 on the basis of the reconstructed image data (step S13).

For example, a high frequency component, among the frequency components of the pulse-shaped magnetic field to be applied to the object 10 by applying a pulse current to the coil 22, is set to be measurement data corresponding to a conductivity distribution in the vicinity of the surface of the object 10. In addition, a low frequency component, among the frequency components of the pulse-shaped magnetic field to be applied to the object 10, is set to be measurement data including information of a conductivity distribution from a shallow position to at a deep position inside the object 10. In this manner, each of the frequency components of the magnetic field to be applied to the object 10 is set to be measurement data necessary for the reconstruction of a three-dimensional image of the conductivity distribution inside the object 10. Meanwhile, the pulse-shaped current is equivalent to the superimposition of currents with a plurality of frequencies.

Meanwhile, the above-described reconstructed image data is equivalent to data indicating a distribution of a magnetic field source which is generated by an eddy current generated inside the object 10. In addition, a magnetic field (first magnetic field) applied to the object 10 by the coil 22, an angular frequency ω, and a magnetic permeability μ are multiplied by the magnetic field source to create a source term of a diffusion-type equation regarding the magnetic field. The magnetic field source m which is generated by an eddy current generated inside the object 10 will be described later in detail. The magnetic field source m can be referred to as a value for determining a relationship between a first magnetic field $H_0$ and a current density $j_e$ of an eddy current. The distribution of the magnetic field source m indicates a distribution of a magnetic field generation source, and the magnitude of the magnetic field source m indicates the magnitude of an effect of generating a magnetic field. The magnetic field source m is a parameter corresponding to a spatial change in the conductivity of the object 10. For example, the magnetic field source m becomes greater as the spatial change in the conductivity of the object 10 becomes greater. It is possible to observe the spatial change in the conductivity of the object 10 as described above by calculating the distribution of the magnetic field source m. Since a conductivity changes in a defective portion in a case where a defect is present inside the object 10, a change in the magnetic field source m corresponding to the spatial change in the conductivity is observed, and thus it is possible to detect the defective portion by detecting the spatial change in the conductivity. A relationship between the magnetic field applied to the object 10 by the coil 22, the magnetic field which is generated by an eddy current generated inside the object 10, the magnetic field source m, and the conductivity will be described below.

[2. Computation Theory and Analysis Model for Generating Reconstructed Image Data]

Hereinafter, a computation theory and an analysis model for generating reconstructed image data, which is performed by the computational unit 30, will be described.

Figure 5:
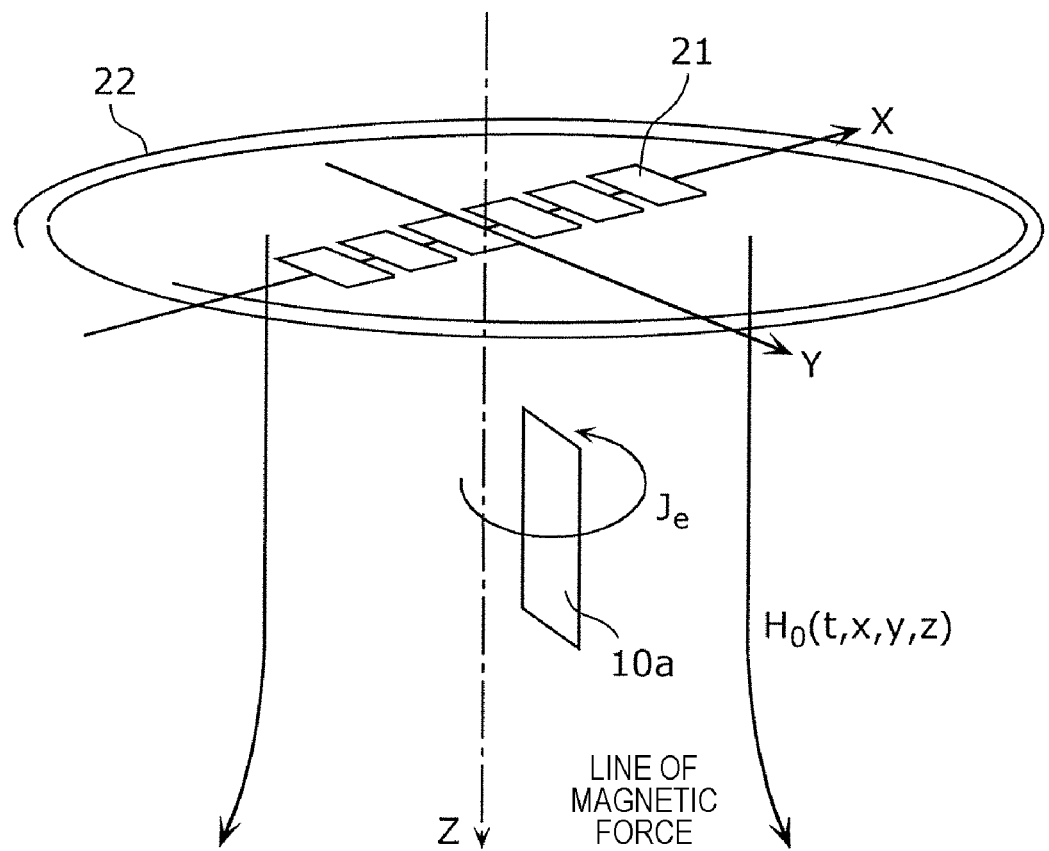
FIG. 5 illustrates an analysis model for explaining the theory of an observation method according to the first embodiment.
Figures 6, 7:
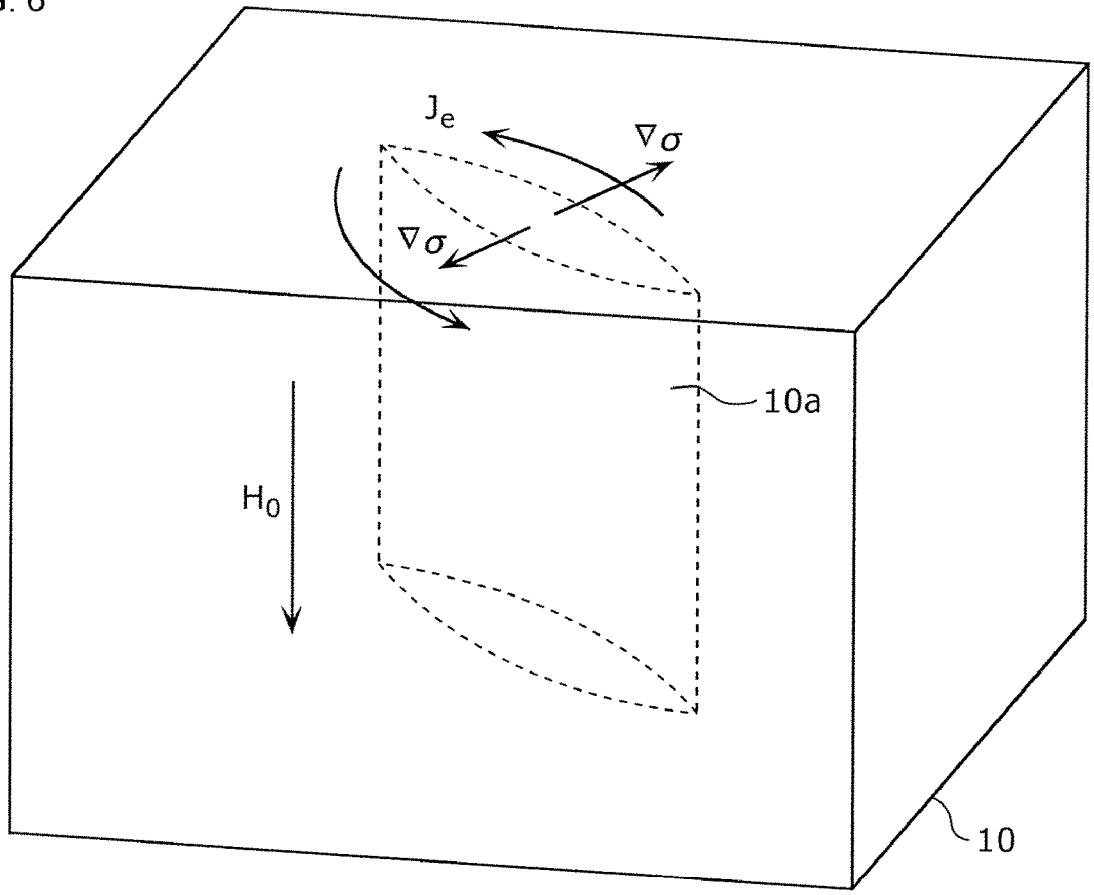
FIG. 6 illustrates an analysis model for explaining the theory of an observation method according to the first embodiment.
FIG. 7 is a diagram illustrating a relationship between a conductivity, a magnetic permeability, and a penetration depth of a magnetic field.

FIGS. 5 and 6 illustrate analysis models for explaining a computation theory for generating reconstructed image data in the observation device 1 according to this embodiment. In FIG. 5, the depth direction of the object 10 is set to be a Z-direction, and an XY plane when z=0 is set to be the surface of the object 10. That is, the sensor 21 is disposed on the XY plane when z=0, and the coil 22 is disposed at a position separated from the XY plane at a predetermined distance so that a surface forming the annular shape of the coil 22 becomes parallel to the XY plane. In addition, the sensor 21 moves on the surface of the object 10 during measurement, and thus FIG. 5 shows a plurality of positions at which the sensor 21 is disposed on the XY plane.

Meanwhile, the coil 22 may be disposed at a position separated from the XY plane at a predetermined distance, or may be disposed on the XY plane. The coil 22 may be mechanically connected to the sensor 21, and may move on the surface of the object 10 as one body.

In addition, in a theory to be described below, an electrically conductive material having a defect 10a therein is set to be the object 10 to construct an analysis model of a conductivity distribution of the object 10. As illustrated in FIG. 6, in the analysis model, the object 10 has the defect 10a therein. In the analysis model, when a magnetic field $H_0$ is applied to the object 10 having the defect 10a by the observation device 1, an eddy current is generated in a direction in which the magnetic field $H_0$ is canceled. That is, a current $j_e$ is generated in the vicinity of the defect 10a. A magnetic field generated by the current $j_e$ at this time is detected by the sensor 21 and is applied to the analysis model, so that a conductivity distribution of the object 10 is observed by the observation device 1. It is possible to observe the defect 10a inside the object 10 from the observed conductivity distribution. The analysis model of the conductivity distribution of the object 10 will be described below in detail.

[2-1. Diffusion-Type Equation]

First, a diffusion-type equation which is a fundamental equation in the above-described analysis model of the conductivity distribution will be described.

Here, a medium having substantially a fixed dielectric constant, magnetic permeability, and conductivity is assumed, and the assumed medium is considered to be the object 10. It is assumed that the conductivity is not 0. For example, a problem is targeted which has conditions for establishing the assumption of a quasi-steady magnetic field in portions other than a defective portion in a metal and portions other than an abnormal portion and a boundary portion of a tissue in a living body. A condition for being quasi-steady is $\omega\varepsilon<\sigma$. Meanwhile, the quasi-steady magnetic field is a field in a state where an electric field and a magnetic field fluctuate at lower speed than electromagnetic waves, instead of a field in which an electric field and a magnetic field fluctuate at high speed as in electromagnetic waves.

The quasi-steady magnetic field can be expressed by the following equation. This equation is obtained by omitting the term of a displacement current in Maxwell's equation. Meanwhile, in the following equation, E is an electric field, H is a magnetic field, B is a magnetic flux, $j_e$ is a current density, $\varepsilon$ is a dielectric constant, $\mu$ is a magnetic permeability, and $\sigma$ is a conductivity. The electric field E, the magnetic field H, the magnetic flux B, and the current $j_e$ are vectors, and are indicated by a bold letter in the equations.

$$rot\ E = -\frac{\partial}{\partial t}B \qquad \text{(Equation 1)}$$
$$rot\ H = j_c = \sigma E$$
$$B = \mu H$$
$$div\ B = 0$$

When the electric field E is eliminated from a first equation and a second equation shown in (Equation 1) and the equations are arranged, the following (Equation 2) is obtained.

$$rot\left(\frac{1}{\sigma}rot\ H\right) = -\mu\frac{\partial}{\partial t}H \qquad \text{(Equation 2)}$$

When (Equation 2) is rewritten using a conventional expression of rot=∇×, the following (Equation 3) is obtained.

$$\nabla\times\left(\frac{1}{\sigma}\nabla\times H\right) = -\mu\frac{\partial}{\partial t}H \qquad \text{(Equation 3)}$$

When the left side of (Equation 3) is expanded, the following (Equation 4) is obtained.

$$\nabla \times \left(\frac{1}{\sigma}\nabla \times H\right) = \nabla\left(\frac{1}{\sigma}\right) \times (\nabla \times H) + \frac{1}{\sigma}\nabla \times (\nabla \times H)$$
$$= \nabla\left(\frac{1}{\sigma}\right) \times j_c + \frac{1}{\sigma}\{\nabla(\nabla \cdot H) - \Delta H\}$$
$$= -\frac{1}{\sigma^2}\nabla\sigma \times j_c + \frac{1}{\sigma}\left\{-\nabla\left(\frac{\nabla\mu}{\mu} \cdot H\right) - \Delta H\right\}$$
(Equation 4)

When (Equation 4) is substituted into (Equation 3), an equation shown in the following (Equation 5) is obtained for the magnetic field H.

$$\sigma\mu\frac{\partial}{\partial t}H - \Delta H = \frac{1}{\sigma}\nabla\sigma \times j_c + \nabla\left(\frac{\nabla\mu}{\mu} \cdot H\right)$$
(Equation 5)

Under the assumption, described above, of the medium having substantially a fixed dielectric constant, magnetic permeability, and conductivity, the right side of (Equation 5) is 0 in most locations in a region, but the right side of (Equation 5) is not set to be 0 at a location where σ and μ change. In a discontinuous point, the right side of (Equation 5) is set to be a δ-function-like infinite value. The equation can be regarded as a diffusion-type equation having a source on the assumption that the right side of (Equation 5) is not 0 only in a slight portion in the region.

Meanwhile, the right side of (Equation 5) is a source term of a magnetic field which is generated by an eddy current generated inside the object 10. Here, how the right side of (Equation 5) is generated will be described. A magnetic field generated by an exciting coil depends on only the z-axis illustrated in FIG. 5, and is made uniform in the x-direction and the y-direction. At a location where σ and μ are constant, the following (Equation 6) is established.

$$\sigma\mu\frac{\partial}{\partial t}H_0 - \Delta H_0 = 0$$
(Equation 6)

When $H_0 \propto \exp(i\omega t)$ is assumed, (Equation 6) is expressed as the following (Equation 7).

$$i\omega\sigma\mu H_0(\omega, z) - \frac{d^2}{dz^2}H_0(\omega, z) = 0$$
(Equation 7)

When (Equation 7) is solved, (Equation 8) is obtained.

$$H_0(t, z) = h_0 e^{i\omega t} e^{-\frac{1+i}{\sqrt{2}}\sqrt{\omega\sigma\mu}\,z}$$
(Equation 8)

Here, $h_0$ is a coefficient. In addition, $h_0$ is a vector, and is indicated by a bold letter in the equations.

A penetration depth (skin depth) δ of the magnetic field is expressed by the following (Equation 9).

$$\delta = \sqrt{\frac{2}{\omega\sigma\mu}}$$
(Equation 9)

In general, a magnetic field having a lower frequency component among frequency components of the applied magnetic field penetrates a deeper position from the surface of the object 10. In addition, the magnetic field penetrates a deeper position from the surface of the object 10 as the conductivity σ and the magnetic permeability μ have smaller values.

FIG. 7 is a diagram illustrating a relationship between a conductivity σ, and a magnetic permeability μ, and a penetration depth of a magnetic field. For example, when a relative magnetic permeability and conductivity a of aluminum are respectively set to be 1 and 37.4×10⁻⁶ S/m as illustrated in FIG. 7 in a case where the object 10 is set to be aluminum (Al) which is a non-magnetic body, a frequency component of 1 kHz of a magnetic field penetrates up to a depth of 2.6 mm from the surface of the aluminum.

Here, in a case where the object 10 is configured as a non-magnetic body, the magnetic permeability μ can be set to be constant in (Equation 5). Thereby, a second term on the right side of (Equation 5) is set to be 0. As illustrated in FIG. 6, when the magnetic field $H_0$ is applied to the object 10 having a defect 10a, an eddy current is generated in a direction in which the magnetic field $H_0$ is canceled. That is, as illustrated in FIG. 6, the current $j_e$ is generated in the vicinity of the defect 10a in a direction which is orthogonal to the direction of the magnetic field $H_0$ applied from the outside and a direction for differentiating the conductivity σ and in which the magnetic field $H_0$ to be applied to the object 10 is canceled. Therefore, a first term on the right side of (Equation 5) is proportional to the magnetic permeability μ, the magnetic field $H_0$ to be applied to the object 10, and the frequency ω of magnetic field $H_0$ to be applied to the object 10, and is expressed as the following (Equation 10).

$$\frac{1}{\sigma}\nabla\sigma \times j_c \propto \mu\omega H_0$$
(Equation 10)

Hereinafter, the reason for the establishment of (Equation 10) will be described. (Equation 11) is established on the basis of Maxwell's equation.

$$rotE = -\frac{\partial}{\partial t}B = -i\omega\mu H_0$$
(Equation 11)

When (Equation 11) is integrated with respect to surface ΔS, the left side and the right side are expressed by the following (Equation 12).

$$\iint_S rotE \cdot dS = \oint_{dS} E \cdot dl = El$$
$$\iint_S \left(-\frac{\partial}{\partial t}B\right) \cdot dS = -i\omega\mu \iint_S H_0 \cdot dS \approx -i\omega\mu H_0 \Delta S$$
(Equation 12)

The following (Equation 13) is derived from a second equation of (Equation 12).

$$j_c = \sigma E = -i\sigma\omega\mu H_0 \frac{\Delta S}{l} \qquad \text{(Equation 13)}$$

Therefore, the following (Equation 14) is derived.

$$\frac{1}{\sigma}\nabla\sigma \times j_c = -\frac{i\omega\mu H_0 \Delta S}{l}\nabla\sigma \times t \qquad \text{(Equation 14)}$$

In (Equation 14), t is a unit vector in the circumferential direction, and is indicated by a bold letter in the equation. Here, $\nabla\sigma \times t$ is parallel to $H_0$, it is proved that (Equation 10) is established when the object 10 is assumed to be a non-magnetic body.

Accordingly, the first term on the right side of (Equation 5) can be expressed as the following (Equation 15) on the basis of (Equation 10).

$$\frac{1}{\sigma}\nabla\sigma \times j_c = -m(x, y, z)\{\omega\mu H_0(t, z)\} \qquad \text{(Equation 15)}$$

Meanwhile, (Equation 15) is equivalent to (Equation A) and (Equation E) in the invention. In (Equation 15), $H_0(t,z)$ is an excitation magnetic field. Therefore, (Equation 5) is formulated as the following (Equation 16).

$$\sigma\mu\frac{\partial}{\partial t}H - \Delta H = -m(x, y, z)\{\omega\mu H_0(t, z)\} \qquad \text{(Equation 16)}$$

Here, m(x,y,z) is a magnetic field source, and the right side in (Equation 5) obtained by multiplying the angular frequency ω and the magnetic permeability μ by m(x,y,z) is a source term. As described later, it is possible to obtain reconstructed image data corresponding to a distribution (a spatial change rate distribution of a conductivity) in a change rate of the conductivity σ of the object 10 by obtaining the magnetic field source m(x,y,z). Meanwhile, in (Equation 16), the magnetic field $H_0$ (t,z) to be applied to the object 10 is set to be $H_0(t,z) \propto e^{i\omega t}$ to measure a magnetic field H(t,x,y,z=0) on the surface of the object 10 as described later, and thus it is possible to obtain the magnetic field source m(x,y,z) by using a measurement result as a boundary condition of (Equation 16).

[2-2. General Solution]

Next, the object 10 is configured as a non-magnetic body, and a general solution of a diffusion-type equation regarding a magnetic field in a quasi-steady state will be described.

When Fourier transform is performed on (Equation 16) in the (x,y) direction, the following (Equation 17) is obtained. Here, $k_x$ and $k_y$ are respectively wave numbers of x and y.

$$\sigma\mu\frac{\partial}{\partial t}\tilde{H} + \left(k_x^2 + k_y^2 - \frac{\partial^2}{\partial z^2}\right)\tilde{H} = -\tilde{m}(k_x, k_y, z)\{\omega\mu H_0(t, z)\} \qquad \text{(Equation 17)}$$

Here, (Equation 18) is obtained by performing two-dimensional Fourier transform on the magnetic field source m(x,y,z).

$$\tilde{m}(k_x, k_y, z) \qquad \text{(Equation 18)}$$

Hereinafter, (Equation 18) is referred to as a two-dimensional Fourier transformed magnetic field source m.

When $H \propto \exp(i\omega t)$ is assumed, (Equation 17) is rewritten as the following (Equation 19).

$$\left(\frac{d^2}{dz^2} - k_x^2 - k_y^2 - i\omega\sigma\mu\right)\tilde{H} = \tilde{m}(k_x, k_y, z)\{\omega\mu H_0(t, z)\} \qquad \text{(Equation 19)}$$

In order to obtain the solution of the equation, a basic solution $G(z,z_0)$ is first obtained. Since $H \propto \exp(i\omega t)$ is assumed, $G(z, z_0)$ is selected so as to satisfy the equation shown in the following (Equation 20).

$$\left(\frac{d^2}{dz^2} - k_x^2 - k_y^2 - i\omega\sigma\mu\right)G(z, z_0) = \delta(z - z_0) \qquad \text{(Equation 20)}$$

Here, $G(z,z_0)$ is expressed as the following (Equation 21).

$$G(z, z_0) = \frac{1}{2\sqrt{k_x^2 + k_y^2 + i\omega\sigma\mu}} e^{\sqrt{k_x^2 + k_y^2 + i\omega\sigma\mu}\,|z - z_0|} \qquad \text{(Equation 21)}$$

A general solution of (Equation 17) is expressed as the following (Equation 22).

$$\tilde{H} = ae^{\sqrt{k_x^2+k_y^2+i\omega\sigma\mu}\,z} + be^{-\sqrt{k_x^2+k_y^2+i\omega\sigma\mu}\,z} + \omega\mu\int_{-\infty}^{\infty}G(z, z_0)\tilde{m}(k_x, k_y, z_0)H_0(t, z_0)dz_0 = \qquad \text{(Equation 22)}$$
$$ae^{\sqrt{k_x^2+k_y^2+i\omega\sigma\mu}\,z} + be^{-\sqrt{k_x^2+k_y^2+i\omega\sigma\mu}\,z} +$$
$$\frac{\omega\mu}{2\sqrt{k_x^2+k_y^2+i\omega\sigma\mu}}\int_0^{\infty}e^{\sqrt{k_x^2+k_y^2+i\omega\sigma\mu}\,|z-z_0|}\tilde{m}(k_x, k_y, z_0)H_0(t, z_0)dz_0$$

Here, a and b are vectors, and are indicated by a bold letter in the equations. Meanwhile, in (Equation 22), it is assumed that a two-dimensional Fourier transformed magnetic field source m is not 0.

A boundary condition when z=0 regarding (Equation 22) is given as the following (Equation 23).

$$\tilde{H}(\omega, k_x, k_y, 0) = f(\omega, k_x, k_y) \qquad \text{(Equation 23)}$$
$$\frac{d}{dz}\tilde{H}(\omega, k_x, k_y, 0) = g(\omega, k_x, k_y)$$

Here, $f(\omega,k_x,k_y)$ and $g(\omega,k_x,k_y)$ are data obtained by experiment. That is, $f(\omega,k_x,k_y)$ is measurement data of a frequency component ω of a magnetic field when z=0, that is, on the surface of the object 10 when the magnetic field is applied to the object 10. In addition, $g(\omega,k_x,k_y)$ is obtained by differentiating $H(\omega,k_x,k_y,z)$ with respect to z and then substituting 0. Here, in order to differentiate $H(\omega,k_x,k_y,z)$ with respect to z, it is necessary to measure a distribution of a magnetic field in the vicinity of z=0 in the z-direction. Examples of a method of obtaining the distribution in the z-direction include a method using the sensor 21 including a plurality of detection elements arranged in the z-direction and a method of performing measurement a plurality of times while changing z.

For convenience, when the following equation is given, $$\alpha = \sqrt{k_x^2 + k_y^2 + i\omega\sigma\mu} \qquad \text{(Equation 24)}$$

the following (Equation 25) is obtained from a boundary condition and (Equation 22) by using a coefficient $\alpha$.

$$a + b + \frac{\omega\mu}{2\alpha}\int_0^\infty e^{\alpha|z_0|}\tilde{m}(k_x, k_y, z_0)\overline{H}_0(\omega, z_0)dz_0 = \qquad \text{(Equation 25)}$$

$$f(\omega, k_x, k_y)$$

$$a\alpha - b\alpha - \frac{\omega\mu}{2}\int_0^\infty e^{\alpha|z_0|}\tilde{m}(k_x, k_y, z_0)\overline{H}_0(\omega, z_0)dz_0 =$$

$$g(\omega, k_x, k_y)$$

As described above, a and b are obtained, and thus the following (Equation 26) is established.

$$a = \frac{1}{2}\{f(\omega, k_x, k_y) + g(\omega, k_x, k_y)/\alpha\} \qquad \text{(Equation 26)}$$

$$b = \frac{1}{2}\{f(\omega, k_x, k_y) - g(\omega, k_x, k_y)/\alpha\} -$$

$$\frac{\omega\mu}{2\alpha}\int_0^\infty e^{\alpha|z_0|}\tilde{m}(k_x, k_y, z_0)\overline{H}_0(\omega, z_0)dz_0$$

As described above, a general solution of (Equation 17) is obtained as the following (Equation 27).

$$\overline{H} = \frac{1}{2}\{f(\omega, k_x, k_y) + g(\omega, k_x, k_y)/\alpha\}e^{\alpha z} + \qquad \text{(Equation 27)}$$

$$\frac{1}{2}\{f(\omega, k_x, k_y) - g(\omega, k_x, k_y)/\alpha\}e^{-\alpha z} +$$

$$\frac{\omega\mu}{2\alpha}\int_0^\infty \{-e^{\alpha(z_0-z)} + e^{\alpha|z-z_0|}\}\tilde{m}(k_x, k_y, z_0)\overline{H}_0(\omega, z_0)dz_0$$

Meanwhile, in (Equation 27), the following equation is established.

$$\alpha = \sqrt{k_x^2 + k_y^2 + i\omega\sigma\mu}$$

$$\tilde{H} = e^{i\omega t}\overline{H}(\omega, k_x, k_y, z)$$

$$H_0 = e^{i\omega t}\overline{H}_0(\omega, z) \qquad \text{(Equation 28)}$$

[2-3. Reconstructed Image Data of Conductivity Distribution]

Next, reconstructed image data of a conductivity distribution inside the object 10 will be described. The reconstructed image data of the conductivity distribution inside the object 10 can be calculated from a general solution and an exact solution of the above-described diffusion-type equation.

Figure 8:
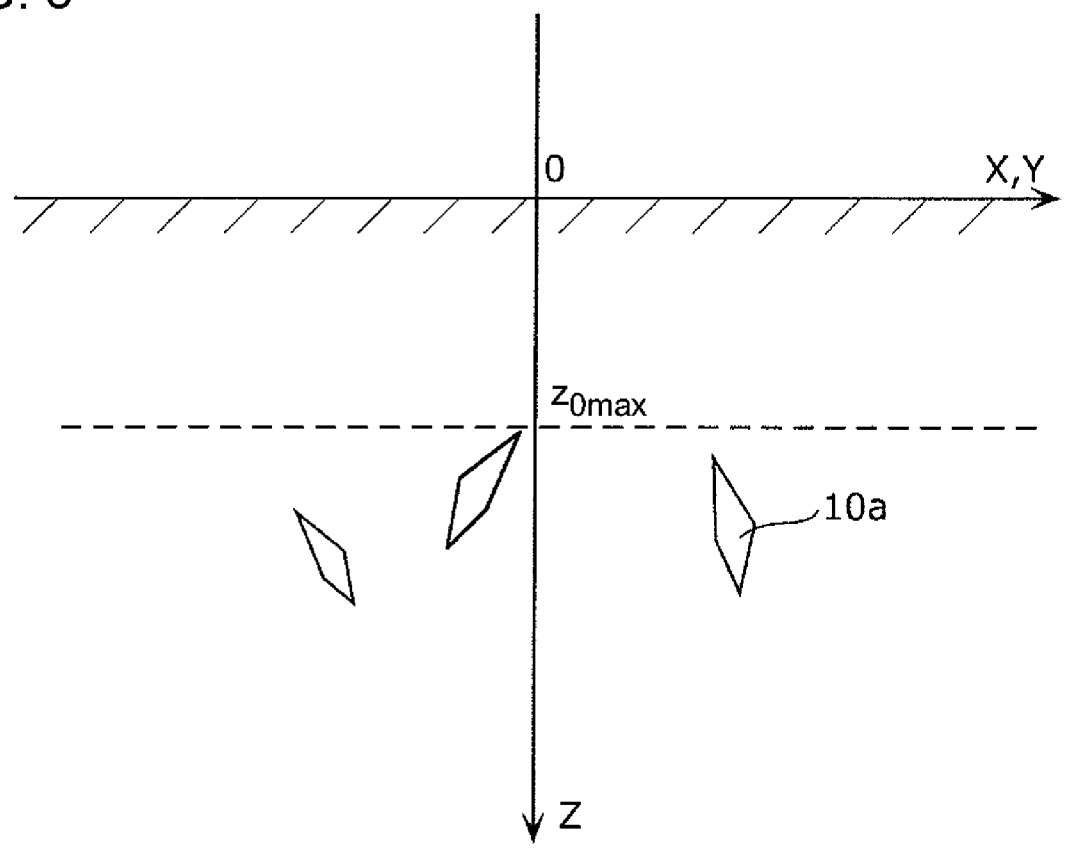
FIG. 8 illustrates an analysis model showing the position of a defect inside an object according to the first embodiment.

FIG. 8 illustrates an analysis model showing the position of a defect inside the object 10 according to this embodiment. In FIG. 8, the depth direction of the object 10 is set to be a z-direction. In FIG. 8, $z=z_{0max}$ indicates the shortest distance between a defect of the object 10 and the surface of the object 10. In addition, $z=z_{max}$ indicates the longest distance between a defect of the object 10 and the surface of the object 10.

Hereinafter, a description will be given by performing division into a region including the defect 10a and a region not including the defect 10a in the depth direction (z-direction) of the object 10.

[2-3-1. Reconstructed Image Data (Derivation of Exact Solution) Regarding Region not Including Defect]

First, a description will be given of the calculation of reconstructed image data of a conductivity distribution in a region not including the defect 10a, in the depth direction (z-direction) of the object 10.

Since there is no defect in a region of $0 \leq z \leq z_{0max}$ illustrated in FIG. 8, a conductivity a is fixed. Therefore, a magnetic field source m(x,y,z) is 0 in the region of $0 \leq z \leq z_{0max}$, and a two-dimensional Fourier transformed magnetic field source m is also 0. In this case, in (Equation 27), the following (Equation 29) is established.

$$-e^{\alpha(z_0-z)} + e^{\alpha|z-z_0|} = 0 \qquad \text{(Equation 29)}$$

Therefore, (Equation 27) is expressed as the following (Equation 30).

$$0 \leq z \leq z_{0max} \qquad \text{(Equation 30)}$$

$$\overline{H} = \frac{1}{2}\{f(\omega, k_x, k_y) + g(\omega, k_x, k_y)/\alpha\}e^{\alpha z} +$$

-continued $$\frac{1}{2}\{f(\omega, k_x, k_y) - g(\omega, k_x, k_y)/\alpha\}e^{\alpha z}$$

Since (Equation 30) does not include a term other than $f(\omega,k_x,k_y)$ and $g(\omega,k_x,k_y)$ showing boundary conditions, H is obtained in the region of $0 \leq z \leq z_{0max}$. In $0 \leq z \leq z_{0max}$, in order to obtain $H(\omega,x,y,z)$ from $\overline{H}(\omega,k_x,k_y,z)$, inverse two-dimensional Fourier transform is performed with respect to $k_x$ and $k_y$. Then, $H(\omega,x,y,z)$ can be expressed as the following (Equation 31).

$$H(\omega, x, y, z) = \frac{1}{(2\pi)^2} \int_{-\infty}^{\infty}\int_{-\infty}^{\infty} e^{ik_x x + ik_y y} \tilde{H}(\omega, k_x, k_y, z) dk_x dk_y \quad \text{(Equation 31)}$$

Here, H(ω,x,y,z) in (Equation 30) and (Equation 31) is an exact solution of a diffusion-type equation in a state where there is no source. By (Equation 31), it is possible to calculate reconstructed image data corresponding to a magnetic field distribution in the 0≤z≤$z_{0max}$ region not including the defect 10*a* in the object 10.

Meanwhile, with regard to a spatial resolution of reconstructed image data, a magnetic dipole is generated at a discontinuous point of a conductivity σ in the object 10, and a magnetic field spreads rapidly in accordance with a distance from the magnetic dipole, and thus the high spatial resolution is not obtained even when the measurement of the magnetic field is performed at a location far from the magnetic dipole. Therefore, in (Equation 27), a position of z=$z_{0max}$ of the defect 10*a* illustrated in FIG. 8 is the position (there is a defect in a region of z>$z_{0max}$) of the defect 10*a* which is closest to the surface of the object 10 and is closest to the magnetic dipole from the surface of the object 10, and thus the highest spatial resolution is obtained at the position of z=$z_{0max}$.

[2-3-2. Reconstructed Image Data (Derivation of m(x,y,z)) Regarding Region Including Defect]

Next, a description will be given of the calculation of reconstructed image data in a region including a defect in the z-direction in the object 10 from the surface of the object 10.

Here, a general solution of (Equation 22) is arranged and expressed again as the following (Equation 32).

$$\tilde{H} = ae^{\alpha z} + be^{-\alpha z} + \frac{\omega\mu}{2\alpha}\int_0^{\infty} e^{\alpha|z-z_0|}\tilde{m}(k_x, k_y, z_0)H_0(t, z_0)dz_0 \quad \text{(Equation 32)}$$

$$\alpha = \sqrt{k_x^2 + k_y^2 + i\omega\sigma\mu}$$

$$Re(\alpha) \le 0$$

Regarding the general solution shown in (Equation 32), it is assumed that a region in which a two-dimensional Fourier transformed magnetic field source $m(k_x,k_y,z)$ is not 0 is within a finite region. That is, it is assumed that a two-dimensional Fourier transformed magnetic field source m is not 0 only in a region of $z_{0max}$<z<$z_{max}$. In this case, a third term on the right side of (Equation 32) approximates 0 by setting z→±∞. In addition, a first term and a second term on the right side of (Equation 32) are terms which are not related to the two-dimensional Fourier transformed magnetic field source $m(k_x,k_y,z)$, and diverge by setting either z→+∞ or z→−∞. This is a magnetic field generated as a result of magnetic induction in an environment surrounding the two-dimensional Fourier transformed magnetic field source $m(k_x,k_y,z)$. In a situation where this environment is fixed, it is possible to erase the first term and the second term on the right side of (Equation 32) by removing a magnetic field $H_{ref}$ which is obtained at a reference point regarded as not being influenced by the two-dimensional Fourier transformed magnetic field source $m(k_x,k_y,z)$, from the magnetic field H as shown in the following (Equation 33).

$$\delta\tilde{H} = \tilde{H} - \tilde{H}_{ref} \quad \text{(Equation 33)}$$

Therefore, (Equation 32) is expressed as the following (Equation 34).

$$\delta\tilde{H} = \frac{\omega\mu}{2\alpha}\int_0^{\infty} e^{\alpha|z-z_0|}\tilde{m}(k_x, k_y, z_0)H_0(t, z_0)dz_0 \quad \text{(Equation 34)}$$

Further, variable conversion as shown in the following (Equation 35) is performed on (Equation 34).

$$\delta\tilde{H} = e^{i\omega t}\delta\overline{H}$$

$$H_0(t,z) = h_0 e^{i\omega t} e^{-\sqrt{i\omega\sigma\mu}z} \quad \text{(Equation 35)}$$

Thereby, (Equation 34) is expressed as the following (Equation 36).

$$\delta\overline{H} = h_0 \frac{\omega\mu}{2\alpha}\int_0^{\infty} e^{\alpha|z-z_0| - \sqrt{i\omega\sigma\mu}\,z_0}\tilde{m}(k_x, k_y, z_0)dz_0 \quad \text{(Equation 36)}$$

Here, when z=0 is applied, the following (Equation 37) is obtained.

$$\delta\overline{H}(\omega, k_x, k_y, z=0) = h_0 \frac{\omega\mu}{2\alpha}\int_0^{\infty} e^{(\alpha - \sqrt{i\omega\sigma\mu})z_0}\tilde{m}(k_x, k_y, z_0)dz_0 \quad \text{(Equation 37)}$$

Meanwhile, (Equation 37) is equivalent to (Equation B) and (Equation F) in the invention. Here, $z_0$ is a z coordinate within a region including a region in which a magnetic field source m(x,y,z) is not 0. Here, (Equation 37) is a type of Laplace transform. Since the left side of (Equation 37) is a parameter capable of being measured, measurement is performed on a parameter on the left side in a range of a frequency component ω of a magnetic field $H_0$ applied to the object 10, and a two-dimensional Fourier transformed magnetic field source $m(k_x,k_y,z)$ is obtained from the measured parameter. Further, it is possible to obtain the magnetic field source m(x,y,z) by performing inverse two-dimensional Fourier transform on the two-dimensional Fourier transformed magnetic field source $m(k_x,k_y,z)$.

By (Equation 37), it is possible to calculate reconstructed image data corresponding to a conductivity distribution in the region including the defect 10*a* in the object 10. That is, it is possible to calculate reconstructed image data corresponding to a conductivity distribution in the region of $z_{0max}$<z<$z_{max}$ illustrated in FIG. 8.

[2-3-3. Reconstructed Image Data (Derivation of m(x,y,z)) Regarding Region Including Defect]

Next, a description will be given of the calculation of reconstructed image data in a region including a defect in the z-direction in the object 10 from the surface of the object 10, in a case where a magnetic field source m(x,y,z) is asymptotically obtained.

In (Equation 22), a first term on the right side represents a magnetic field generated by the coil 22. Further, (Equation 22) is arranged using the boundary conditions shown in (Equation 23).

$$\tilde{H} = ae^{\alpha z} + \frac{\omega\mu}{2\alpha}\int_0^\infty e^{\alpha|z-z_0|}\tilde{m}(k_x, k_y, z_0)H_0(t, z_0)dz_0 \quad \text{(Equation 38)}$$

Here, m(x,y,z) is obtained using boundary conditions expressed by (Equation 38) and the following (Equation 39).
Boundary Conditions
when z=0

(Equation 39)

$$\overline{H}(\omega, k_x, k_y, 0) = f(\omega, k_x, k_y) \quad (1)$$

$$\frac{d}{dz}\overline{H}(\omega, k_x, k_y, 0) = g(\omega, k_x, k_y) \quad (2)$$

From a boundary condition (1), $$a + \frac{\omega\mu}{2\alpha}\int_0^\infty e^{\alpha z_0}\tilde{m}(k_x, k_y, z_0)\overline{H}_0(\omega, z_0)dz_0 = f(\omega, k_x, k_y) \quad \text{(Equation 40)}$$

is established. When a is substituted for (Equation 38), (Equation 41) is established.

(Equation 41)

$$\tilde{H} = fe^{\alpha z} + \frac{\omega\mu}{2\alpha}\int_0^\infty \{-e^{\alpha(z+z_0)} + e^{\alpha|z-z_0|}\}\tilde{m}(k_x, k_y, z_0)\overline{H}_0(\omega, z_0)dz_0$$

$$= \begin{cases} fe^{\alpha z} - \frac{\omega\mu}{\alpha}\sinh(\alpha z)\int_0^\infty e^{\alpha z_0}\tilde{m}(k_x, k_y, z_0)\overline{H}_0(\omega, z_0)dz_0 (z < z_{0max}) \\ fe^{\alpha z} - \frac{\omega\mu}{\alpha}e^{\alpha z}\int_0^\infty \sinh(\alpha z_0)\tilde{m}(k_x, k_y, z_0)\overline{H}_0(\omega, z_0)dz_0 (z > z_{max}) \end{cases} \quad z_{0max} < z < z_{max}$$

Next, when a boundary condition (2) is used, the following (Equation 42) is obtained.

$$\omega\mu\int_0^\infty e^{\alpha z_0}\tilde{m}(k_x,k_y,z_0)H_0(\omega,z_0)dz_0 = f\alpha - g \quad \text{(Equation 42)}$$

The right side in (Equation 42) is a known function. The right side in (Equation 42) is a function of a frequency ω, and thus (Equation 42) can be regarded as an integral equation regarding a two-dimensional Fourier transformed magnetic field source m($k_x$,$k_y$,z) When the magnetic field $H_0$ shown in (Equation 35) is substituted for (Equation 42), the following (Equation 43) is expressed.

$$h_0\omega\mu\int_0^\infty e^{(\alpha-\sqrt{i\omega\sigma\mu})z_0}\tilde{m}(k_x,k_y,z_0)dz_0 = f\alpha - g \quad \text{(Equation 43)}$$

Next, an integral equation shown in (Equation 43) is solved. When series expansion is performed the two-dimensional Fourier transformed magnetic field source m($k_x$,$k_y$,z) with respect to z, the following (Equation 44) is obtained.

$$\tilde{m}(k_x, k_y, z) = \sum_{n=0}^{N} a_n z^n \quad \text{(Equation 44)}$$

When (Equation 44) is substituted for (Equation 43), the following (Equation 45) is obtained.

$$h_0\omega\mu\sum_{n=0}^{N} a_n \int_0^\infty e^{(\alpha-\sqrt{i\omega\sigma\mu})z_0}z_0^n dz_0 = f\alpha - g \quad \text{(Equation 45)}$$

Here, an integral in (Equation 45) is expressed as the following (Equation 46).

$$\int_0^\infty e^{(\alpha-\sqrt{i\omega\sigma\mu})z_0}z_0^n dz_0 = (-\alpha+\sqrt{i\omega\sigma\mu})^{-n-1}\Gamma(n+1) \quad \text{(Equation 46)}$$

In (Equation 46), Γ(n+1) is a gamma function.
As described above, (Equation 47) is obtained.

$$h_0\omega\mu\sum_{n=0}^{N}(-\alpha+\sqrt{i\omega\sigma\mu})^{-n-1}\Gamma(n+1)a_n = f\alpha - g \quad \text{(Equation 47)}$$

(Equation 47) is established with respect to ω ($\omega_{min} \le \omega \le \omega_{max}$) in a certain range. Naturally, the right side in (Equation 47) is also a function of a frequency ω.

Here, $a_n$ is obtained from the simultaneous equation.

Thereby, a spatial change in a conductivity distribution inside the object 10 can be expressed by a magnetic field source m(x,y,z). Therefore, the spatial change in the conductivity distribution is observed by applying a magnetic field to the object 10, and thus it is possible to detect a defect inside the object 10.

Meanwhile, (Equation 44) is equivalent to (Equation C) and (Equation G) in the invention. (Equation 47) is equivalent to (Equation D) and (Equation H) in the invention.

Specifically, a three-dimensional distribution of a spatial change in a conductivity inside the object 10 is obtained as follows according to the above-described principle. Meanwhile, in processing performed by the observation device 1, σ can be regarded as a conductivity of the object 10, ω can be regarded as an angular frequency of a frequency in a plurality of frequencies components, which are obtained by performing Fourier transform on a pulse current, or currents with a plurality of frequencies, μ can be regarded as a magnetic permeability of the object 10, $H_0$ can be regarded as a first magnetic field, $j_e$ can be regarded as a current density of an eddy current generated in a direction in which the first magnetic field is canceled, t can be regarded as a time, z can be regarded as a coordinate in the depth direction of the object 10, and x and y can be regarded as respective coordinates in two orthogonal directions in a plane which is perpendicular to the depth direction.

Measurement data a is acquired by moving the coil 22 and the sensor 21 in a plane (xy plane) perpendicular to the depth direction (z-direction) of the object 10 on the surface (z=0) of the object 10 or in the vicinity of the surface and detecting a component of an angular frequency ω of a magnetic field at each point within the xy plane. The measurement data a is H(ω,x,y,0). The acquisition of the measurement data a is performed on a plurality of angular frequencies ω.

Specifically, the measurement data a regarding the angular frequency ω can be acquired as in the following first example or second example. The first example is an example in a case where a pulse current is applied to the coil 22, and the second example is an example in a case where currents with a plurality of frequencies are applied to the coil 22 in order.

First, in the first example, a pulse current is applied to the coil 22, and a magnetic field is measured by the sensor 21. Measurement data a is obtained for each of a plurality of angular frequencies ω by performing inverse Fourier transform on a pulse response waveform of a magnetic field which is an output signal of the sensor 21.

In the second example, a current of a predetermined frequency is applied to the coil 22, and a magnetic field of the frequency is measured by the sensor 21. Specifically, for example, a detected signal indicating the intensity of the frequency component is obtained by making the output signal of the sensor 21 to passes through a lock-in amplifier. The frequency of a current to be applied to the coil 22 and a frequency to be detected are changed to similarly acquire other frequency components in order. In this manner, measurement data a is obtained for each of a plurality of angular frequencies ω.

Fourier transform is performed on each piece of measurement data a, which is obtained by the method as shown in the first example or the second example, with respect to x and y to obtain a variable f regarding a boundary condition at an angular frequency ω. In addition, measurement data a' indicating a distribution of a magnetic field is obtained with respect to the angular frequency ω as described above by slightly changing z. It is preferable to obtain a plurality of pieces of measurement data a' centered on z=0. A variable g regarding a boundary condition at the angular frequency ω is obtained by performing Fourier transform on the obtained pieces of measurement data a' with respect to x and y, obtaining a differentiate with respect to z of the magnetic field from the Fourier-transformed measurement data a and the plurality of pieces of measurement data a', and substituting z=0.

Here, $a_n$ is obtained by substituting f and g, which are obtained for each of the plurality of angular frequencies ω, for (Equation 47) described above and solving a simultaneous equation. A two-dimensional Fourier transformed magnetic field source $m(k_x,k_y,z)$ is obtained by substituting the obtained $a_n$ for (Equation 44) described above. It is possible to obtain a magnetic field source m(x,y,z) by performing inverse two-dimensional Fourier transform on the two-dimensional Fourier transformed magnetic field source $m(k_x,k_y,z)$. The magnetic field source m(x,y,z) corresponds to a spatial change rate distribution of a conductivity inside the object 10. Therefore, it is possible to ascertain a defect inside the object 10 by displaying an imaging showing the magnetic field source m(x,y,z).

[3. Effects and the Like]

As described above, in the observation device 1 and the observation method according to this embodiment, it is possible to detect a defect inside the object 10 by observing a conductivity distribution inside the object 10 such as a conductor. When the conductivity distribution inside the object 10 is observed, a pulse-shaped magnetic field is applied to the object 10 by the coil 22 and a spatial distribution of the magnetic field is detected by the sensor 21 to obtain measurement data.

In this case, the computational unit 30 obtains a magnetic field source m(x,y,z) depending on a gradient of a conductivity by computation by using a frequency component of the magnetic field and measurement data regarding the spatial distribution as boundary conditions. Thereby, it is possible to calculate a change rate distribution of a conductivity of the object 10.

In addition, as the pulse-shaped magnetic field to be applied to the object 10 by the coil 22, a magnetic field having a frequency band in which the generated magnetic field is set to be in a quasi-steady state is used. It is possible to observe a conductivity distribution inside an electrical conductive material, which is difficult to be observed in high-frequency electromagnetic waves or a steady magnetic field, as an object to be observed.

In addition, it is also possible to acquire measurement data required to reconstruct a conductivity distribution in the depth direction of the object 10 by performing measurement a plurality of times while changing a frequency of a magnetic field to be applied to the object 10 by the coil 22.

In addition, coefficients obtained by performing series expansion on a function, which is obtained by performing two-dimensional Fourier transform on a magnetic field source m(x,y,z) with respect to x and y, with respect to a variable z are sequentially obtained using experimental data, and thus it is possible to precisely obtain a spatial change rate distribution of a three-dimensional conductivity.

Figure 9:
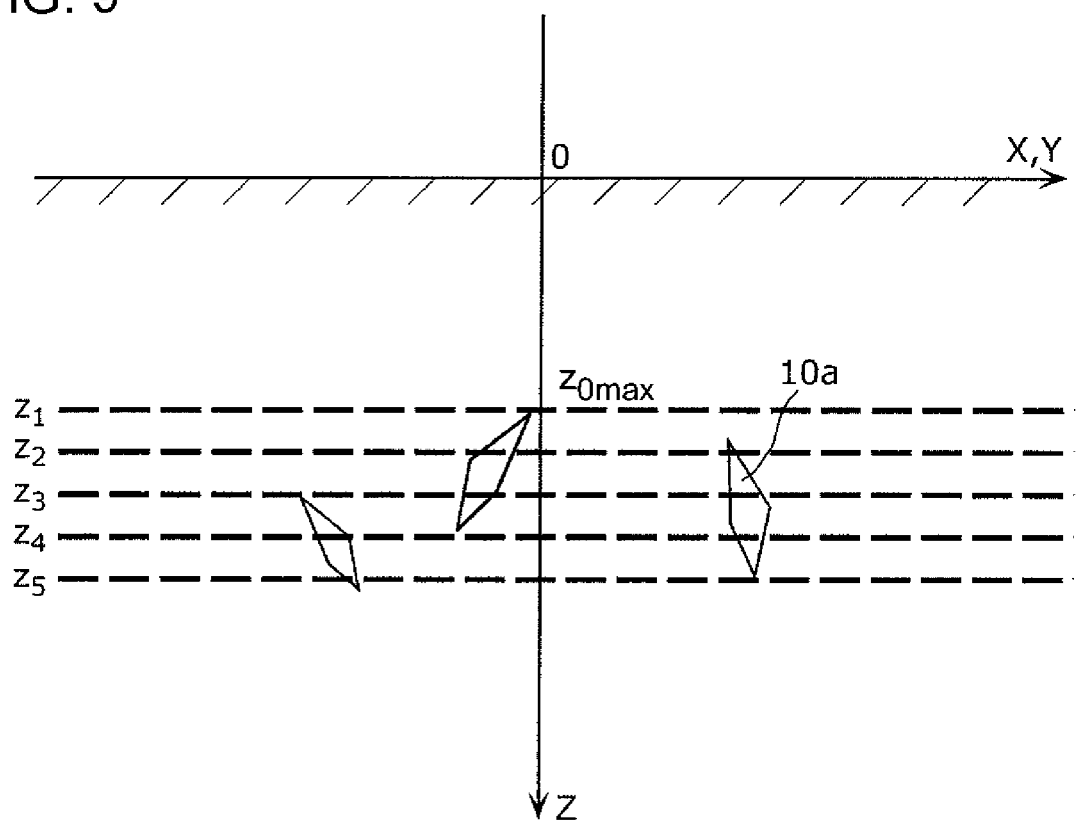
FIG. 9 is a diagram illustrating effects of the observation device according to the first embodiment.

FIG. 9 is a diagram illustrating effects of the observation device according to this embodiment. According to the observation device of this embodiment, a magnetic field source m(x,y,z) is obtained with respect to depths z1 to z5, and the like, and information equivalent to a spatial change rate distribution of a three-dimensional conductivity is obtained. In this manner, it is possible to observe the position, shape, and size of the defect 10a.

Meanwhile, the above-described computing equations and the procedures of deriving the computing equations are examples, and another computing equation and another derivation procedure may be used. For example, the observation device 1 may appropriately calculate a distribution of a conductivity by obtaining a magnetic field source m(x,y,z) from measurement data of a magnetic field measured for each rotation angle and each coordinate position by using a computing equation derived from a combination of a shape function, a Fourier transform, Laplace's equation, and the like, or may use series expansion.

In this embodiment, a conductor is described as an example of an object, but the object is not limited to the conductor and may be a living body or another object having a conductivity σ as a parameter.

Second Embodiment

Next, a second embodiment will be described.

In this embodiment, an object which is a non-magnetic body that does not have a high conductivity like a metal and have a negligible dielectric effect is assumed as an object 10 having a defect 10a. For example, an analysis model regarding the observation of the defect 10 in a case where a living body is set to be the object 10 will be described.

[4-1. Diffusion-Type Equation]

First, a diffusion-type equation which is a fundamental equation will be described. Maxwell's equation is expressed as the following (Equation 48). Here, ρ is a charge density, and D is a dielectric flux density. The dielectric flux density D is a vector, and is indicated by a bold letter in the equations.

$$rotE = -\frac{\partial}{\partial t}B \quad \text{(Equation 48)}$$

$$rotH = j_e + \frac{\partial}{\partial t}D = \sigma E + \varepsilon\frac{\partial}{\partial t}E$$

$$B = \mu H$$

$$divB = 0$$

$$D = \varepsilon E$$

$$divD = \rho_c$$

When H∝exp(iωt) is assumed, Maxwell's equation is expressed as the following (Equation 49).

$$rot\, E = -i\omega\mu H$$

$$rot\, H = \sigma E + i\omega\varepsilon E \quad \text{(Equation 49)}$$

When E is erased from (Equation 49), the following (Equation 50) is obtained.

$$rot\left(\frac{1}{\sigma + i\omega\varepsilon}rotH\right) = -i\omega\mu H \quad \text{(Equation 50)}$$

When (Equation 50) is rewritten, the following (Equation 51) is obtained.

$$\nabla \times \left(\frac{1}{\sigma + i\omega\varepsilon}\nabla \times H\right) = -i\omega\mu H \quad \text{(Equation 51)}$$

The left side of (Equation 51) can be expressed as follows.

$$\nabla \times \left(\frac{1}{\sigma + i\omega\varepsilon}\nabla \times H\right) = -i\omega\mu H \quad \text{(Equation 52)}$$

$$= \nabla\frac{1}{\sigma + i\omega\varepsilon} \times \nabla \times H +$$

$$\frac{1}{\sigma + i\omega\varepsilon}\nabla \times \nabla \times H$$

$$= \nabla\frac{1}{\sigma + i\omega\varepsilon} \times \nabla \times H +$$

$$\frac{1}{\sigma + i\omega\varepsilon}\{\nabla(\nabla \cdot H) - \Delta H\}$$

The following (Equation 53) is obtained from (Equation 51) and (Equation 52)

$$i\omega\mu(\sigma + i\omega\varepsilon)H - \Delta H = \frac{\nabla(\sigma + i\omega\varepsilon)}{\sigma + i\omega\varepsilon} \times \nabla \times H + \nabla\left(\frac{\nabla\mu}{\mu} \cdot H\right) \quad \text{(Equation 53)}$$

(Equation 53) is a fundamental equation regarding a magnetic field.

Here, the following equation can be written.

$$\nabla \times H = j_e + j_d \quad \text{(Equation 54)}$$

Here, $j_d$ is a current density of a displacement current. It is assumed that the right side of (Equation 53) is 0 at most locations where σ, ε, and μ are fixed. The right side of (Equation 53) can be considered as a source (or dispersion) from a discontinuous point.

Here, a source term will be described. At a location where σ, ε, and μ are fixed, the following (Equation 55) is established by setting the right side of (Equation 53) to be 0.

$$i\omega\mu(\sigma + i\omega\varepsilon)H_0(\omega, z) - \frac{d^2}{dz^2}\Delta H_0(\omega, z) = 0 \quad \text{(Equation 55)}$$

Here, $H_0(t,z)$ is expressed as the following (Equation 56)

$$H_0(t,z) = h_0 e^{i\omega t} e^{-\sqrt{i\omega\mu(i\sigma - \omega\varepsilon)}z} \quad \text{(Equation 56)}$$

In (Equation 56), $h_0$ is a vector that does not depend on t and z. A condition for a quasi-steady state is established when ωε≪σ.

[4-2. Observation of Defect of Non-Magnetic Body]

In a case where the object 10 is a non-magnetic body, μ is fixed, and thus a second term on the right side of (Equation 53) is set to be 0. The following (Equation 57) and (Equation 58) are obtained by Maxwell's equation.

$$\nabla \times H = j_c + \varepsilon\frac{\partial E}{\partial t} \quad \text{(Equation 57)}$$

$$= (\sigma + i\omega\varepsilon)E$$

$$\nabla \times E = -\mu\frac{\partial H}{\partial t} \quad \text{(Equation 58)}$$

$$= -i\omega\mu H$$

When (Equation 58) is integrated, the following (Equation 59) is obtained.

$$\nabla \times E = -\mu\frac{\partial H}{\partial t} \quad \text{(Equation 59)}$$

$$= -i\omega\mu H$$

$$\int\int_S \nabla \times E \cdot ds = \oint_{\partial S} E \cdot dl \approx El$$

$$= -i\omega\mu\int\int_S H \cdot ds$$

$$= -i\omega\mu HS$$

The following (Equation 60) is obtained from (Equation 59).

$$E = -i\omega\mu\frac{S}{l}Ht \quad t\text{: unit vector} \quad \text{(Equation 60)}$$

As described above, the right side of (Equation 53) is expressed as the following (Equation 61).

$$\frac{\nabla(\sigma + i\omega\varepsilon)}{\sigma + i\omega\varepsilon} \times \nabla \times H = \left(-i\omega\mu\frac{S}{l}H_0\right)\nabla(\sigma + i\omega\varepsilon) \times t$$

$$= \left(-i\omega\mu\frac{S}{l}H_0\right)\nabla\sigma \times t + \left(\omega^2\varepsilon\mu\frac{S}{l}H_0\right)\nabla\varepsilon \times t$$

$$= \mu\omega M_1(x, y, z) \cdot H_0 + \omega^2\varepsilon\mu M_2(x, y, z) \cdot H_0$$

(Equation 61)

Here, M1 and M2 are tensors and are not dependent on ω. In this case, (Equation 53) which is a fundamental equation is expressed as the following (Equation 62).

$$i\omega\mu(\sigma+i\omega\varepsilon)H - \Delta H = \mu\omega M_1(x,y,z) \cdot H_0 + \omega^2\varepsilon\mu M_2(x,y,z) \cdot H_0 \quad \text{(Equation 62)}$$

Here, H(t,x,y,z=0) is measured on a surface in a region to obtain M1 and M2. When two-dimensional Fourier transform is performed with respect to x and y, the following (Equation 63) is obtained.

$$i\omega\mu(\sigma + i\omega\varepsilon)\tilde{H} + \left(k_x^2 + k_y^2 - \frac{\partial^2}{\partial z^2}\right)\tilde{H} =$$

$$\mu\omega\tilde{M}_1(k_x, k_y, z) \cdot H_0 + \omega^2\varepsilon\mu\tilde{M}_2(k_x, k_y, z) \cdot H_0$$

(Equation 63)

Here, the following equation is given.

$$\tilde{H}(\omega,k_x,k_y,z) = \int_{-\infty}^{\infty}\int_{-\infty}^{\infty} e^{-ik_x x - ik_y y} H(\omega,x,y,z) dx dy \quad \text{(Equation 64)}$$

Next, a basic solution is configured. The basic solution is a solution of an equation shown in the following (Equation 65).

$$\left\{\frac{d^2}{dz^2} - k_x^2 - k_y^2 - i\omega\mu(\sigma + i\omega\varepsilon)\right\}G(z, z_0) = \delta(z - z_0) \quad \text{(Equation 65)}$$

The basic solution is expressed as the following (Equation 66)

$$G(z, z_0) = \frac{1}{2\sqrt{k_x^2 + k_y^2 + i\omega\mu(\sigma + i\omega\mu)}} e^{\sqrt{k_x^2 + k_y^2 + i\omega\mu(\sigma + i\omega\mu)}|z - z_0|} \quad \text{(Equation 66)}$$

Here, for convenience, a variable shown in the following (Equation 67) is induced.

$$\alpha = \sqrt{k_x^2 + k_y^2 + i\omega\mu(\sigma + i\omega\mu)} \quad \text{(Equation 67)}$$

In this case, a result shown in the following (Equation 68) is obtained as a method using an exact solution, similar to a case in a quasi-steady state.

$$0 \le z \le z_{0max}$$

$$\overline{H} = \frac{1}{2}\{f(\omega, k_x, k_y) + g(\omega, k_x, k_y)/\alpha\}e^{\alpha z} +$$

$$\frac{1}{2}\{f(\omega, k_x, k_y) - g(\omega, k_x, k_y)/\alpha\}e^{\alpha z}$$

(Equation 68)

Therefore, the following equation is obtained.

$$H(\omega, x, y, z) = \frac{1}{(2\pi)^2}\int_{-\infty}^{\infty}\int_{-\infty}^{\infty} e^{ik_x x + ik_y y} \tilde{H}(\omega, k_x, k_y,) dk_x dk_y \quad \text{(Equation 69)}$$

As described above, also in the analysis model according to this embodiment, it is assumed that a magnetic field generated by a coil 22 depends on only a z coordinate in the analysis model illustrated in FIG. 5, similar to the first embodiment. A frequency band of a pulse-shaped magnetic field to be applied so as to satisfy $2\pi f\varepsilon \ll \sigma$ is set. Thereby, it is also possible to observe an object, such as a living body, which has a low conductivity relative to metals and has a non-negligible dielectric effect, by using a quasi-steady magnetic field.

FIG. 10 is a diagram illustrating a relationship between a frequency component of a magnetic field to be applied and a penetration depth (transmission depth) of the magnetic field. In a case where the object 10 is set to be a living body, frequency dependency of a penetration depth of the living body is as illustrated in FIG. 10. Here, a penetration depth $\delta_s$ refers to a depth at which the magnitude of a magnetic field to penetrate is set to be 1/e times.

Meanwhile, it is preferable that a frequency band of a pulse-shaped magnetic field to be applied is set to be a frequency band satisfying $2\pi f\varepsilon \ll \sigma$, with respect to an object that does not have a high conductivity like a metal and have a negligible dielectric effect.

As described above, the observation device according to the invention has been described on the basis of a plurality of embodiments, but the invention is not limited to the embodiments. A configuration obtained by performing modification, which is conceived by one skilled in the art, on the embodiment, and another configuration realized by arbitrarily combining components in the plurality of embodiments are also included in the invention.

For example, a process executed by a specific processing unit may be executed by another processing unit. In addition, the order of execution of processes may be changed, or a plurality of processes may be executed in parallel.

In addition, the invention can be realized not only as an observation device but also as a method in which processing units constituting the observation device are configured as steps. For example, these steps are executed by a computer. The invention can be realized as a program causing a computer to execute steps included in these methods. Further, the invention can be realized as a non-transitory computer-readable recording medium, such as CD-ROM, in which the program is recorded.

In addition, a plurality of components included in the observation device may be realized as LSI which is an integrated circuit. The components may be individually configured as chips, or may be configured as one chip so as to include a portion or all of the components. Here, the LSI has been mentioned, but the LSI may also be referred to as an Integrated Circuit (IC), a system LSI, a super LSI, or an ultra LSI in accordance with a difference in the degree of integration.

In addition, a method for configuring an integrated circuit is not limited to LSI, and may be realized by a dedicated circuit or a general-purpose processor. A Field Programmable Gate Array (FPGA) capable of performing programming or a reconfigurable processor capable of reconfiguring the connection and setting of circuit cells inside LSI may be used.

Further, when a technique for configuring an integrated circuit, which is replaced with LSI by the progress of a semiconductor technique or another derived technique, appears, components included in the observation device may be configured as an integrated circuit by using the technique.

EXAMPLE

A distribution of a spatial change rate of a conductivity inside a test model was observed by using the observation device and the observation method which are described in the first embodiment.

Figure 11A:
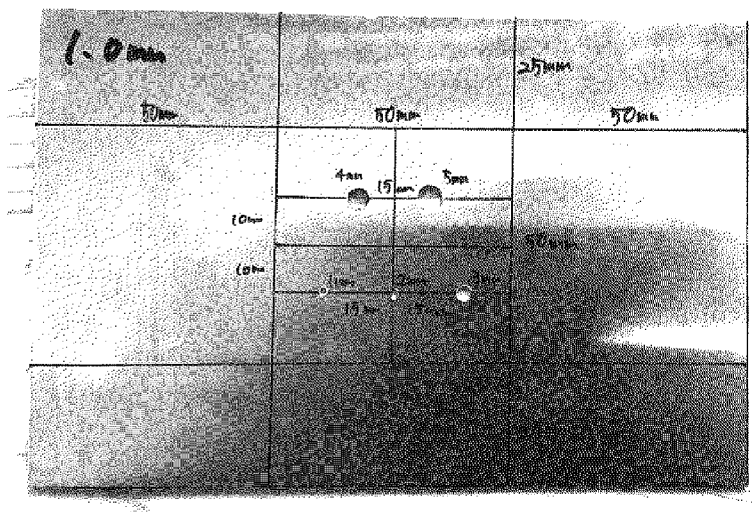
FIGS. 11(a) and 11(b) are photos of a member constituting a test model.
Figure 11B:
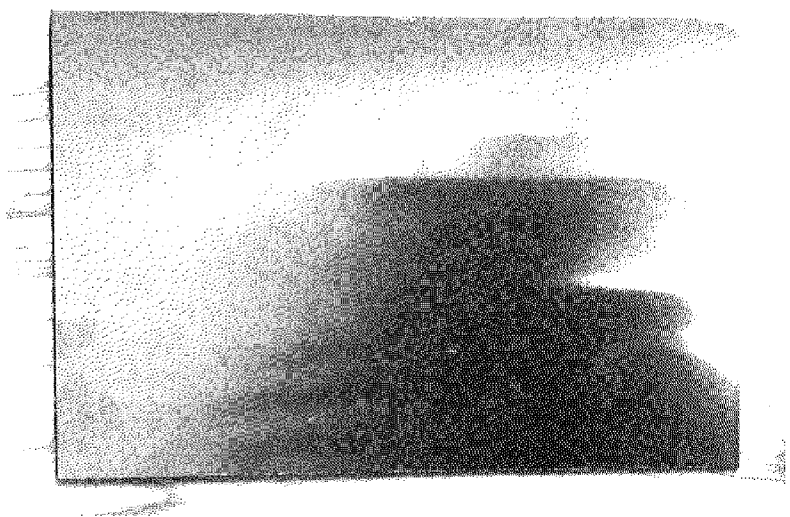
Figure 12A:
FIGS. 12(a) to 12(d) are respectively cross-sectional views of test models according to Examples 1 to 4.
Figure 12B:
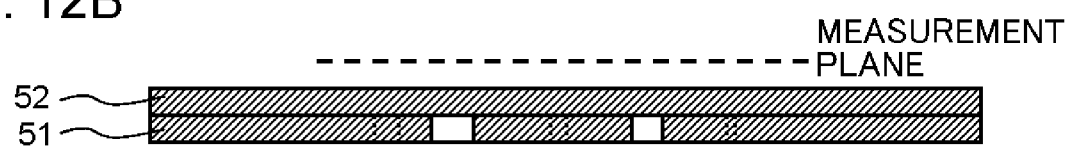
Figure 12C:
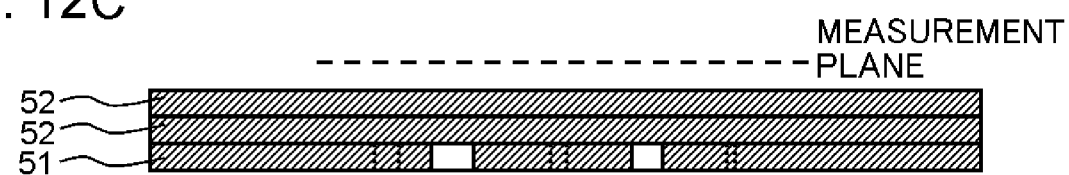
Figure 12D:
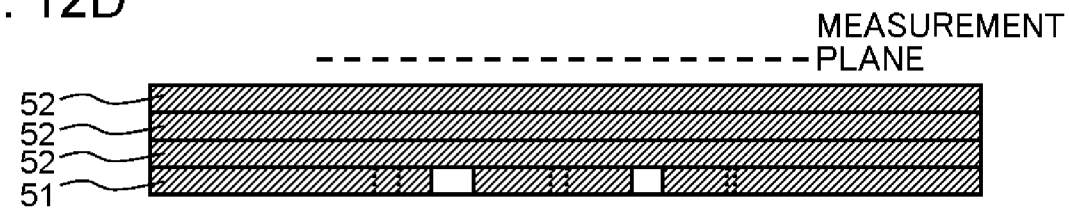

FIGS. 11(a) and 11(b) are photos of a member constituting a test model. The member illustrated in FIG. 11(a) is an aluminum plate 51 having a through hole as a pseudo defect, and the member illustrated in FIG. 11(b) is an aluminum plate 52 that does not have a hole. The thicknesses of both the aluminum plate 51 and the aluminum plate 52 were 1 mm.

FIGS. 12(a) to 12(d) are respectively cross-sectional views of test models according to Examples 1 to 4. Each of the drawings illustrates a cross-section parallel to the thickness direction of an aluminum plate.

In Example 1, one aluminum plate 51 having a hole was used as the test model. A magnetic field was measured while moving a coil and a sensor in the vicinity of the surface of the aluminum plate 51 having the hole. Regarding the measurement of the magnetic field, specifically, the coil and the sensor were moved in a plane perpendicular to the depth direction of the aluminum plate 51, and an alternating current was applied to the coil and the magnetic field was measured by the sensor at each point in the plane. A specific frequency component in the measured magnetic field was detected by a lock-in amplifier.

In Examples 2 to 4, an assembly including the aluminum plate 51 having a hole and one to three aluminum plates 52 not having a hole and laminated on the aluminum plate 51 was respectively used as the test models. A magnetic field was measured while moving the coil and the sensor in the vicinity of the surface of the aluminum plate 52 positioned at the uppermost layer.

Figure 13A:
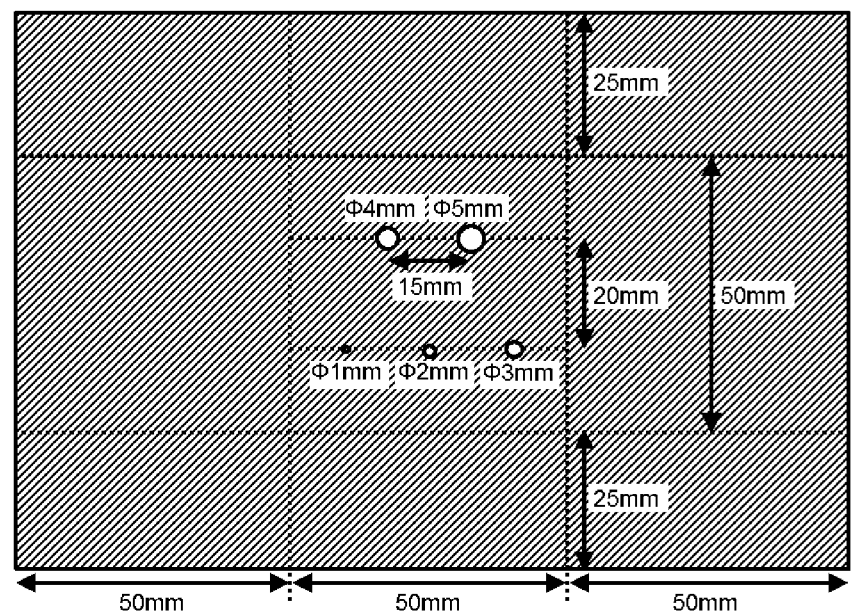
FIG. 13(a) is a plan view of an aluminum plate having holes.

FIG. 13(a) is a plan view of the aluminum plate 51 having a hole. The aluminum plate 51 was provided with through holes respectively having diameters of 1 mm, 2 mm, 3 mm, 4 mm, and 5 mm. In addition, a distance between the centers of the holes was set to be 15 mm.

Figure 13B:
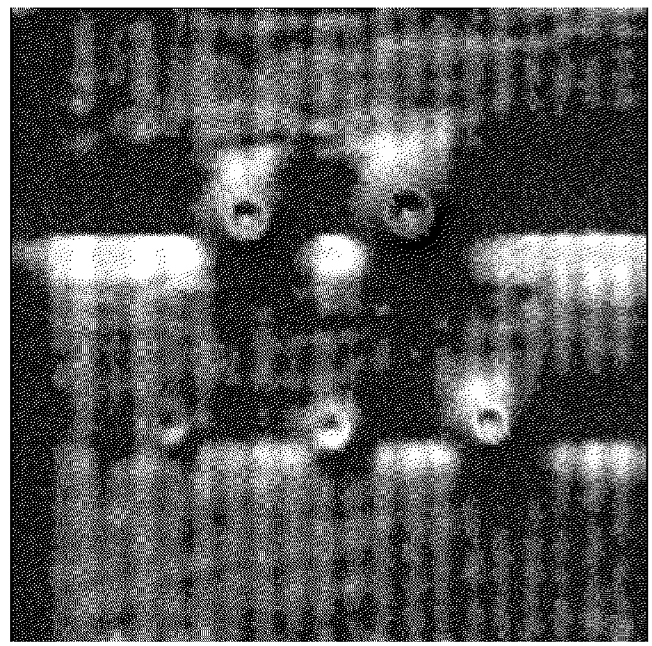
FIG. 13(b) is a diagram illustrating a distribution of a magnetic field measured with respect to the test model according to Example 1.

FIG. 13(b) is a diagram illustrating a distribution of a magnetic field measured with respect to the test model according to Example 1. Measurement conditions were as follows.

Measurement range: 60 mm×60 mm
definition: 128 pixels×128 pixels
Frequency of current to be applied to coil: 50 kHz
Magnitude of current to be applied to coil: 400 mA$_{pp}$
Time constant of lock-in amplifier: 30 msec
Sensitivity of lock-in amplifier: 1 V As illustrated in the drawing, it can be understood that it is possible to acquire information on the holes of the test model in a component having a frequency 50 kHz of a magnetic field.

A resultant obtained by performing Fourier transform on data 1a illustrated in the drawing with respect to x and y is equivalent to a variable f regarding a boundary condition in $\omega=2\pi\times50000$ rad/s. Similarly, it is possible to acquire data 1a with respect to each of a plurality of angular frequencies $\omega$, to obtain a variable g regarding a boundary condition as described in the first embodiment, and to derive a three-dimensional distribution of a spatial change rate of a conductivity inside the test model by using the obtained f and g.

Figure 14A:
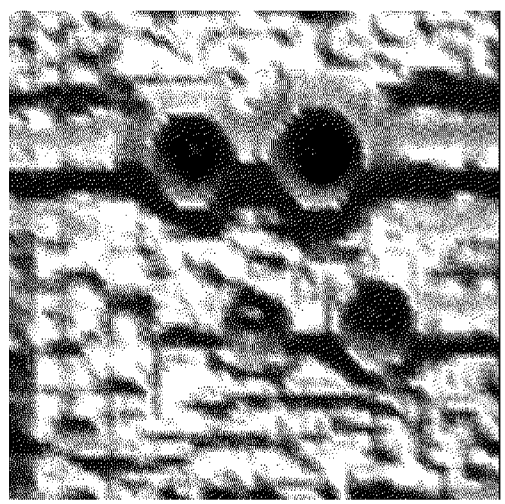
FIGS. 14(a) to 14(c) are diagrams illustrating distributions of magnetic fields which are respectively measured with respect to the test models according to Examples 2 to 4.
Figure 14B:
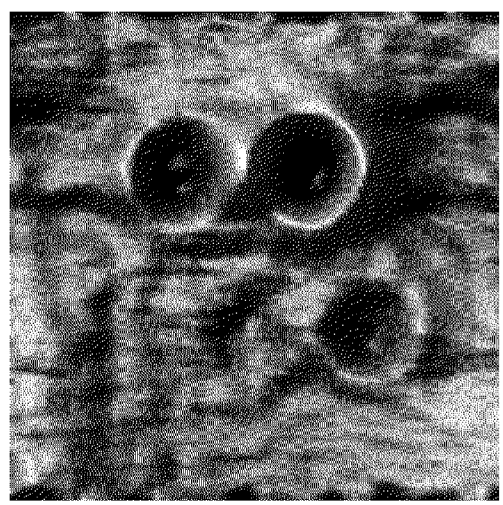
Figure 14C:
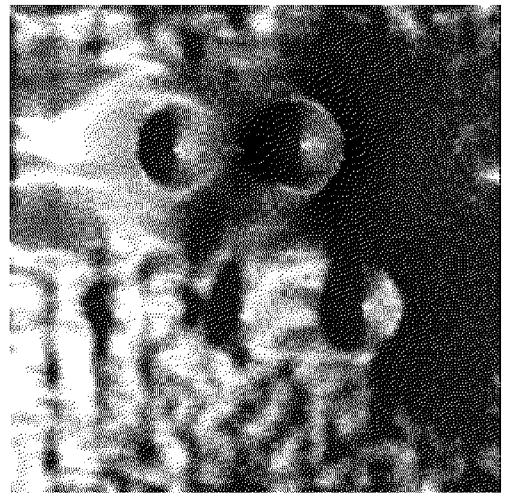

FIGS. 14(a) to 14(c) are diagrams illustrating distributions of magnetic fields which are respectively measured with respect to the test models according to Examples 2 to 4. Each measurement was performed as described in Example 1, except for the following measurement conditions.

Example 2

Frequency of current to be applied to coil: 10 kHz
Time constant of lock-in amplifier: 100 msec
Sensitivity of lock-in amplifier: 300 mV

Example 3

Frequency of current to be applied to coil: 4 kHz
Time constant of lock-in amplifier: 30 msec
Sensitivity of lock-in amplifier: 300 mV

Example 4

Frequency of current to be applied to coil: 1 kHz
Time constant of lock-in amplifier: 100 msec
Sensitivity of lock-in amplifier: 300 mV As illustrated in FIGS. 14(a) to 14(c), it can be understood that it is possible to acquire information on the holes respectively positioned at depths of equal to or greater than 1 mm, equal to or greater than 2 mm, and equal to or greater than 3 mm of the test models, in components having frequencies of 10 kHz, 4 kHz, and 1 kHz of a magnetic field.

As described above, the embodiments of the invention have been described with reference to the accompanying drawings. However, the embodiments are illustrative of the invention, and other various configurations can also be adopted.

Hereinafter, an example of a reference configuration will be appended.

1-1. A conductivity distribution observation method of observing a conductivity distribution inside an object, the conductivity distribution observation method including:

an application step of applying a first magnetic field to the object by applying a pulse current to a coil by an application unit;

a detection step of detecting the first magnetic field generated by the pulse current applied to the coil and a second magnetic field generated by an eddy current generated inside the object by applying the first magnetic field to the object, by a detection unit;

a calculation step of calculating a magnetic field source m due to the second magnetic field and the first magnetic field applied to the object by the coil, by a calculation unit; and an image signal generation step of generating an image signal for imaging a distribution of the magnetic field source m.

1-2. The conductivity distribution observation method according to 1-1, wherein the first magnetic field and the second magnetic field are quasi-steady electromagnetic fields.

1-3. The conductivity distribution observation method according to 1-2, wherein a frequency band of the pulse current is equal to or less than 1 GHz.

1-4. The conductivity distribution observation method according to any one of 1-1 to 1-3,
wherein the magnetic field source m satisfies the following (Equation A), $$\frac{1}{\sigma}\nabla\sigma \times j_e = -m(x, y, z)\{\omega\mu H_0(t, z)\} \quad \text{(Equation A)}$$

where, σ is a conductivity, ω is an angular frequency, μ is a magnetic permeability, $H_0$ is the first magnetic field, j is a current, t is a time, and z is a coordinate in a depth direction of the object.

1-5. The conductivity distribution observation method according to any one of 1-1 to 1-4,
wherein a function $\tilde{m}(k_x,k_y,z)$ obtained by performing two-dimensional Fourier transform on the magnetic field source m satisfies the following (Equation B), $$\delta\tilde{H}(\omega, k_x, k_y, z=0) = \quad \text{(Equation B)}$$
$$h_0 \frac{\omega\mu}{2\alpha} \int_0^\infty e^{(\alpha-\sqrt{i\omega\sigma\mu})z_0} \tilde{m}(k_x, k_y, z_0) dz_0$$

where, $h_0$ and α are coefficients.

1-6. The conductivity distribution observation method according to any one of 1-1 to 1-4,
wherein the function obtained by performing two-dimensional Fourier transform on the magnetic field source m is expressed by series expansion shown in the following (Equation C), and
wherein the magnetic field source m is calculated by (Equation C) described above and the following (Equation D), $$\tilde{m}(k_x, k_y, z) = \sum_{n=0}^{N} a_n z^n \quad \text{(Equation C)}$$

$$h_0 \omega\mu \sum_{n=0}^{N} \left(-\alpha + \sqrt{i\omega\sigma\mu}\right)^{-n-1} \Gamma(n+1) a_n = f\alpha - g \quad \text{(Equation D)}$$

where, $a_n$ is a coefficient, f and g are variables indicating a boundary condition, and Γ(n+1) is a gamma function.

1-7. A conductivity distribution observation device that observes a conductivity distribution inside an object, the conductivity distribution observation device including:
an application unit that applies a first magnetic field to the object by applying a pulse current to a coil;
a detection unit that detects the first magnetic field and a second magnetic field generated by an eddy current generated inside the object by applying the first magnetic field to the object;
a calculation unit that calculates a magnetic field source m due to the second magnetic field and the first magnetic field applied to the object by the coil, and generates an image signal for imaging a distribution of the magnetic field source m as a distribution of a conductivity; and
a display unit that displays the image signal.

1-8. The conductivity distribution observation device according to 1-7,
wherein the first magnetic field and the second magnetic field are quasi-steady electromagnetic fields.

1-9. The conductivity distribution observation device according to 1-8,
wherein a frequency band of the pulse current is equal to or less than 1 GHz.

1-10. The conductivity distribution observation device according to any one of 1-7 to 1-9,
wherein the magnetic field source m satisfies the following (Equation E), $$\frac{1}{\sigma}\nabla\sigma \times j_e = -m(x, y, z)\{\omega\mu H_0(t, z)\} \quad \text{(Equation E)}$$

where, σ is a conductivity, ω is an angular frequency, μ is a magnetic permeability, $H_0$ is the first magnetic field, j is a current, t is a time, and z is a coordinate in a depth direction of the object.

1-11. The conductivity distribution observation device according to any one of 1-7 to 1-10,
wherein a function $\tilde{m}(k_x,k_y,z)$ obtained by performing two-dimensional Fourier transform on the magnetic field source m satisfies the following (Equation F), $$\delta\tilde{H}(\omega, k_x, k_y, z=0) = \quad \text{(Equation F)}$$
$$h_0 \frac{\omega\mu}{2\alpha} \int_0^\infty e^{(\alpha-\sqrt{i\omega\sigma\mu})z_0} \tilde{m}(k_x, k_y, z_0) dz_0$$

where, $h_0$ and α are coefficients.

1-12. The conductivity distribution observation device according to any one of 1-7 to 1-10,
wherein the function obtained by performing two-dimensional Fourier transform on the magnetic field source m is expressed by series expansion shown in the following (Equation G), and
wherein the magnetic field source m is calculated by (Equation G) and the following (Equation H), $$\tilde{m}(k_x, k_y, z) = \sum_{n=0}^{N} a_n z^n \quad \text{(Equation G)}$$

$$h_0 \omega\mu \sum_{n=0}^{N} \left(-\alpha + \sqrt{i\omega\sigma\mu}\right)^{-n-1} \Gamma(n+1) a_n = f\alpha - g \quad \text{(Equation H)}$$

where, $a_n$ is a coefficient, f and g are variables indicating a boundary condition, and Γ(n+1) is a gamma function.

INDUSTRIAL APPLICABILITY

The observation device according to the invention can be applied to, for example, the examination of a defect inside a cylinder of an engine, the examination of an electronic component, the examination of a next-generation LSI interconnect, the examination of a defect inside a structure such as a tunnel, and medical diagnosis for analyzing a living body.

The application is based on Japanese Patent Application No. 2015-224321 filed on Nov. 16, 2015, the content of which is incorporated herein by reference.

The invention claimed is:
1. An observation method comprising:
an application step of applying a first magnetic field, which is generated by applying a pulse current to a coil or applying currents with a plurality of frequencies to the coil in order, to an object;

a detection step of detecting a second magnetic field generated by applying the first magnetic field to the object; and a calculation step of calculating a distribution of a magnetic field source m in the second magnetic field, wherein a function $\tilde{m}(k_x,k_y,z)$ obtained by performing two-dimensional Fourier transform on the magnetic field source m is expressed by series expansion shown in the following (Equation C), wherein the magnetic field source m is calculated using (Equation C), and $a_n$ in (Equation C) satisfies the following (Equation D), $$\tilde{m}(k_x, k_y, z) = \sum_{n=0}^{N} a_n z^n \quad \text{(Equation C)}$$

$$h_0 \omega \mu \sum_{n=0}^{N} \left(-\alpha + \sqrt{i\omega\sigma\mu}\right)^{-n-1} \Gamma(n+1) a_n = f\alpha - g \quad \text{(Equation D)}$$

where, z is a coordinate in a depth direction of the object, $k_x$ and $k_y$ are respectively wave numbers of x and y which are coordinates in two orthogonal directions in the plane perpendicular to the depth direction, σ is a conductivity of the object, μ is a magnetic permeability of the object, ω is an angular frequency of a frequency in the plurality of frequencies components, which are obtained by performing Fourier transform on the pulse current, or the currents of the plurality of frequencies, N is an integer, $h_0$, α, and $a_n$ are coefficients, f and g are variables indicating a boundary condition on the surface of the object, and Γ(n+1) is a gamma function.

2. The observation method according to claim 1, further comprising:

a step of generating an imaging signal for displaying the calculated distribution of the magnetic field source m, as an image; and a step of displaying an image indicating the distribution of the magnetic field source m by using the imaging signal.

3. The observation method according to claim 1, wherein the first magnetic field and the second magnetic field are quasi-steady magnetic fields.

4. The observation method according to claim 3, wherein a frequency band of the pulse current or the currents with the plurality of frequencies is equal to or less than 1 GHz.

5. The observation method according to claim 1, wherein the object is a non-magnetic body.

6. An observation device comprising:

an application unit that applies a first magnetic field, which is generated by applying a pulse current to a coil or applying currents with a plurality of frequencies to the coil in order, to an object;

a detection unit that detects a second magnetic field generated by applying the first magnetic field to the object; and a calculation unit that calculates a distribution of a magnetic field source m in the second magnetic field, wherein a function $\tilde{m}(k_x,k_y,z)$ obtained by performing two-dimensional Fourier transform on the magnetic field source m is expressed by series expansion shown in the following (Equation G), wherein the magnetic field source m is calculated using (Equation G), and $a_n$ in (Equation G) satisfies the following (Equation H), $$\tilde{m}(k_x, k_y, z) = \sum_{n=0}^{N} a_n z^n \quad \text{(Equation G)}$$

$$h_0 \omega \mu \sum_{n=0}^{N} \left(-\alpha + \sqrt{i\omega\sigma\mu}\right)^{-n-1} \Gamma(n+1) a_n = f\alpha - g \quad \text{(Equation H)}$$

where, z is a coordinate in a depth direction of the object, $k_x$ and $k_y$ are respectively wave numbers of x and y which are coordinates in two orthogonal directions in the plane perpendicular to the depth direction, σ is a conductivity of the object, μ is a magnetic permeability of the object, ω is an angular frequency of a frequency in the plurality of frequencies components, which are obtained by performing Fourier transform on the pulse current, or the currents of the plurality of frequencies, N is an integer, $h_0$, α, and $a_n$ are coefficients, f and g are variables indicating a boundary condition on the surface of the object, and Γ(n+1) is a gamma function.

7. The observation device according to claim 6, wherein the calculation unit generates an imaging signal for displaying the calculated distribution of the magnetic field source m, as an image; and wherein the observation device further comprises a display unit that displays the image indicating the distribution of the magnetic field source m by using the imaging signal.

8. The observation device according to claim 6, wherein the first magnetic field and the second magnetic field are quasi-steady magnetic fields.

9. The observation device according to claim 8, wherein a frequency band of the pulse current or the currents with the plurality of frequencies is equal to or less than 1 GHz.

10. The observation device according to claim 6, wherein the object is a non-magnetic body.

* * * * *